United States Patent
Kurosawa

(10) Patent No.: US 7,812,927 B2
(45) Date of Patent: Oct. 12, 2010

(54) SCANNING EXPOSURE TECHNIQUE

(75) Inventor: Hiroshi Kurosawa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 575 days.

(21) Appl. No.: 11/770,115

(22) Filed: Jun. 28, 2007

(65) Prior Publication Data

US 2007/0250290 A1 Oct. 25, 2007

Related U.S. Application Data

(62) Division of application No. 10/969,075, filed on Oct. 21, 2004.

(30) Foreign Application Priority Data

Oct. 23, 2003 (JP) ............................. 2003-362867

(51) Int. Cl.
G03B 27/42 (2006.01)
G03B 27/52 (2006.01)
(52) U.S. Cl. ......................................... 355/53; 355/55
(58) Field of Classification Search ............... 355/53, 355/55, 72; 356/399, 400, 401; 250/492.2
See application file for complete search history.

(56) References Cited

U.S. PATENT DOCUMENTS 4,748,333 A 5/1988 Mizutani et al. ............ 250/561

(Continued)

FOREIGN PATENT DOCUMENTS

JP 62-299716 12/1987

(Continued)

*Primary Examiner*—Peter B Kim
(74) *Attorney, Agent, or Firm*—Fitzpatrick, Cella, Harper & Scinto

(57) ABSTRACT

A scanning exposure apparatus for performing exposure of a substrate to light includes a projection optical system to project light from the original onto the substrate, a stage to hold the substrate and to move in a scanning direction, and a focus detector to detect a position of a surface region of the substrate in a direction of the optical axis. The apparatus (i) detects the position of the surface region with respect to each of a plurality of measurement points and with respect to each of a plurality of shot regions of the substrate, (ii) averages the detected positions, (iii) obtains a function which approximates the averaged positions, (iv) calculates a difference between each of the averaged positions and a value of the obtained function, (v) offsets a detected position with a corresponding one of the calculated differences, (vi) controls a position of the stage based on the offset positions, and (vii) logs the obtained function.

15 Claims, 23 Drawing Sheets

U.S. PATENT DOCUMENTS

| | | | |
|---|---|---|---|
| 5,112,133 A | 5/1992 | Kurosawa et al. | 356/401 |
| 5,118,957 A | 6/1992 | Kawashima et al. | 250/561 |
| 5,182,615 A | 1/1993 | Kurosawa et al. | 356/400 |
| 5,640,227 A | 6/1997 | Kato et al. | 355/53 |
| 5,883,701 A | 3/1999 | Hasegawa et al. | 355/53 |
| 5,898,477 A | 4/1999 | Yoshimura et al. | 355/53 |
| 6,657,703 B2 | 12/2003 | Kurosawa | 355/55 |
| 6,704,093 B2 | 3/2004 | Kurosawa | 355/53 |
| 6,870,599 B2 | 3/2005 | Kurosawa | 355/53 |
| 2002/0145713 A1 | 10/2002 | Kurosawa | 355/53 |
| 2002/0145716 A1 | 10/2002 | Kurosawa | 355/53 |
| 2002/0176082 A1 | 11/2002 | Sakakibara et al. | 356/400 |
| 2003/0102443 A1 | 6/2003 | Kurokawa | 250/492.3 |
| 2004/0066498 A1 | 4/2004 | Kurosawa | 355/55 |
| 2004/0227918 A1 | 11/2004 | Kurosawa | 355/55 |
| 2005/0052634 A1 | 3/2005 | Sugihara et al. | 355/55 |

FOREIGN PATENT DOCUMENTS

| | | |
|---|---|---|
| JP | 2-102518 | 4/1990 |
| JP | 6-36987 | 2/1994 |
| JP | 6-52707 | 2/1994 |
| JP | 7-272999 | 10/1995 |
| JP | 2002-222760 | 8/2002 |

FIG. 8A  FIG. 8B  FIG. 8C
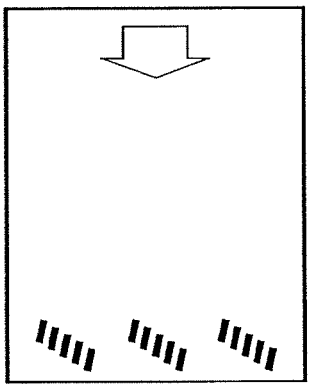
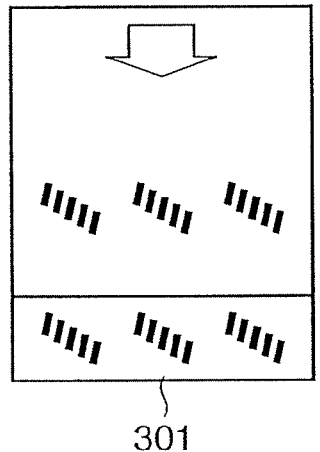
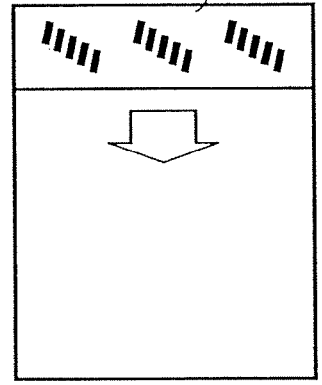
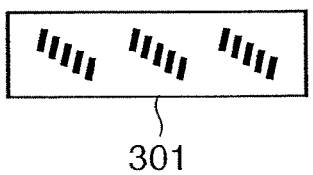

F I G. 15
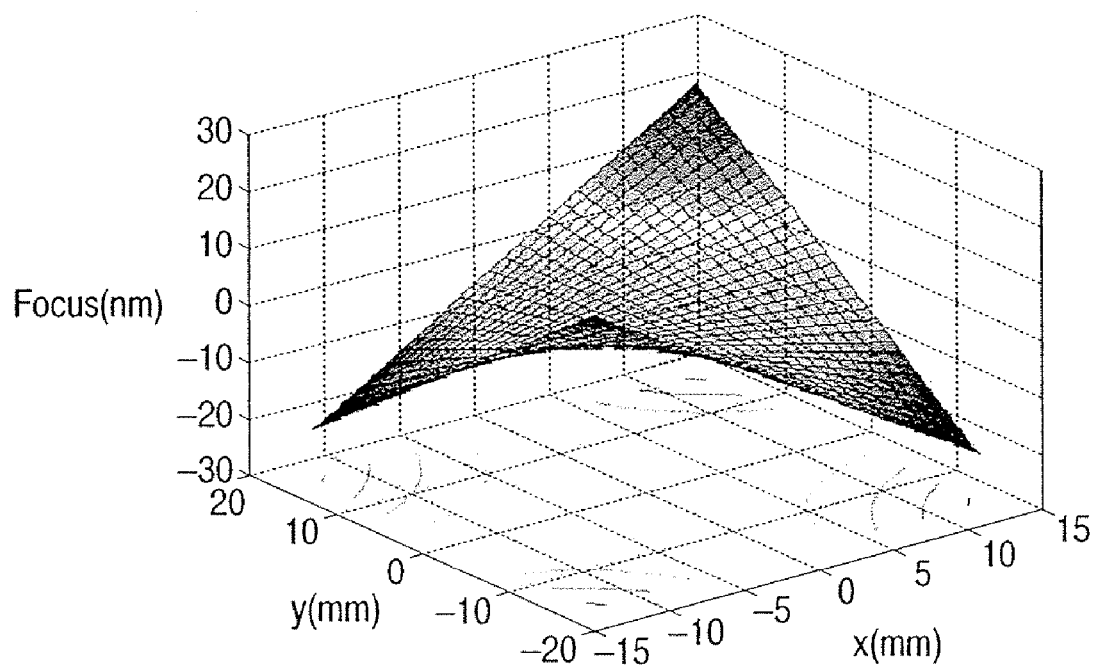

FIG. 21

```
<LotID>
021225133800_AA
</LotID>
<SPOC>
<SPOC_MeasurementNo>
1
<SPOC_MeasurementNo>
<SPOCsigma>
20.2 18.3
</SPOCsigma>
<SPOC diff>
1.2
</SPOC diff>
<SPOCfunc>
0.00108 0.000280 0.022876 0.000091 0.000039 0.000000 0.00098 0.000281 0.022888 0.000090 0.000044
0.000000
</SPOCfunc>
</SPOC>
<Wiat>
    . . . . . . .
</Exposure>
<SPOC>
<SPOC_MeasurementNo>
2
<SPOC_MeasurementNo>
<SPOCsigma>
21.3 18.9
</SPOCsigma>
    . . . . .
</SPOC>
```

1

SCANNING EXPOSURE TECHNIQUE

This application is a divisional application of copending U.S. patent application Ser. No. 10/969,075, filed Oct. 21, 2004.

FIELD OF THE INVENTION

The present invention relates to a scanning exposure technique.

BACKGROUND OF THE INVENTION

A process of measuring the surface position of a substrate, such as a wafer, while scanning the substrate to obtain a pattern offset (also to be referred to as SPOC (Scanning Pattern Offset Compensation) hereinafter) will be described first. SPOC means scanning a plurality of shots on a process wafer and obtaining a three dimensional pattern within each shot formed by wiring lines, insulators, and the like. A result obtained by averaging measurement data for the plurality of shots is used as pattern offset data for correcting an output from a focus measurement unit in scanning exposure. This allows smooth focusing (wafer movement) without tracking any slight step in a pattern within the shot. In a stationary exposure apparatus, generation of local defocus or offsets can be reduced by obtaining a shot representative plane free from the influence of any projections and recesses of an underlying pattern or scattering. In a scanning exposure apparatus, focus measurement is not performed at one time. A plurality of predetermined focus measurement points within each shot are sequentially measured during exposure, and a stage holding a wafer is driven on the basis of the measurement result. Accordingly, if a focus measurement value greatly varies to an underlying pattern, disturbance unnecessary for the stage is supplied as a position target value, and the synchronization precision in the X and Y directions may be decreased. For this reason, by performing pattern offset correction to suppress a short period of information of projections and recesses, which depends on the pattern of the underlying layer within a shot, both focus control performance and synchronization control performance are improved.

As a surface position detection mechanism for aligning a substrate serving as an object to be exposed with an exposure region image plane onto which a master pattern is projected, for example, there is known a method of providing a vertical position detection system which measures a plurality of points within an exposure region on a substrate and calculating and adjusting the tilt and vertical position of the exposure region from the vertical position information of the plurality of points, as described in Japanese Patent Laid Open Nos. 62-299716 and 2-102518.

As a method of removing a detection error between vertical position detection systems, i.e., so-called focus sensors arranged to measure a plurality of points within an exposure region, there is known a method as described in Japanese Patent Publication No. 6-52707.

As seen in the above-mentioned examples, an optical surface position detection mechanism, which uses a laser, LED, or the like, as a light source, has become the mainstream. In a general optical method, a slit image illuminated by the light source is obliquely projected onto a substrate serving as an object to be detected using a projection imaging optical system. The slit image is formed again on a position detecting element using a light receiving imaging optical system, and the vertical position of the substrate surface serving as the object to be detected is detected as the position of the slit image on the position detecting element.

In the optical method, the substrate surface serving as a surface to be detected must be sufficiently planarized by applying a resist, and must be able to be considered as an optical mirror plane. The optical method aims at increasing the reflectivity on the planarized resist surface and detecting the position of the resist surface by setting the incident angle with respect to the substrate surface to 70° or more.

In a surface position detection mechanism, a position detection system is provided for a plurality of points within an exposure region to cause the exposure region on the substrate to coincide with the imaging plane of a projection system. With this arrangement, the tilt and vertical position of the exposure region are measured. A surface position adjustment mechanism performs surface alignment at a high precision by adjusting the surface position of the substrate on the basis of the measurement result. The surface position adjustment mechanism further performs stable and high precision surface alignment by correcting (suppressing) high frequency components (pattern offset) of the substrate surface shape depending on the pattern of the underlying layer.

In current pattern offset measurement by an exposure apparatus, scan focus measurement is performed by fixing target values for the Z-, ωx-, and ωy-axes on the basis of a global tilt plane determined by a result of global tilt measurement. Extraction of high frequency components, or the like, is performed for the obtained surface position measurement value, thereby obtaining a pattern offset for correcting a measurement value from a focus measurement unit. With this method, a difference between a wafer stage running plane and an approximate curved surface (approximate plane) of the wafer pattern surface is set as the pattern offset of the focus measurement unit. Accordingly, the target coordinate locus of the stage during exposure will trace an approximate plane of an almost smooth curved surface (plane) whose pattern offset is canceled as the best focus plane.

For example, in Japanese Patent Publication No. 6-52707, which pertains to a conventional example, there is disclosed a method of obtaining the least square plane from the focus measurement result of a plurality of points whose pattern offsets are subtracted, aligning a region to be exposed so as to conform to the plane, and performing exposure.

Along with miniaturization in transfer pattern, the diameter of a projection lens of an exposure apparatus increases. For this reason, the depth of focus of a pattern imaging plane is generally 0.3 to 0.4 μm with respect to a target line width of 0.11 μm. An error, which can be assigned to focusing of an exposure pattern onto a wafer becomes 30 to 40 nm. To focus a region to be exposed across the shot region within the depth, LTV (Local Thickness Variation) of a process wafer must be restricted. This forces disadvantageous conditions in terms of the wafer cost and process management. Thus, there has been a demand for a method of performing high precision focus and exposure processing without strictly restricting the LTV of the wafer.

According to a scanning exposure method using a slit scan, by aligning a substrate to be exposed with the local shape of a shot to be exposed being scanned, a focus margin can be ensured more than a stationary collective exposure method. As a conventional example, there is disclosed a method of supposing a wafer shape as a curved surface represented by a polynomial function and obtaining the pattern offset by subtracting the curved surface from a substrate surface position measurement value. However, in a scanning exposure apparatus, it is difficult to eliminate a tracking deviation with respect to a high-degree wafer surface shape, such as a ramp waveform, in discrete focus measurement and tracking control, only by performing pattern offset correction for a measurement value from a focus sensor.

SUMMARY OF THE INVENTION

The present invention has as its exemplified object to improve focus tracking performance in a scanning exposure system.

To attain the above-mentioned object, according to the first aspect of the present invention, there is provided a scanning exposure apparatus comprising an optical system which projects a pattern of an original onto a substrate, a stage which holds the substrate and moves in a scanning direction perpendicular to an optical axis of the optical system, a measurement system which measures a position, in a direction of the optical axis, of a surface region of the substrate, and a control system which performs feedback control of a position of the stage by generating data of a target position, in the direction of the optical axis, of the stage based on data of the position of the surface region measured by the measurement system, and performs feedforward control of the position of the stage by adding data of a surface shape of the substrate obtained in advance to the data of the target position, while moving the stage in the scanning direction.

According to the second aspect of the present invention, there is provided a scanning exposure apparatus comprising an optical system which projects a pattern of an original onto a substrate, a stage which holds the substrate and moves in a scanning direction perpendicular to an optical axis of the optical system, a measurement system which measures a position, in a direction of the optical axis, of a surface region of the substrate, and a control system which performs feedback control of a position of the stage by generating data of a target position, in the direction of the optical axis, of the stage, based on data of a position, in the direction of the optical axis, at which the surface region is to be placed and data of the position of the surface region measured by the measurement system, and performs feedforward control of the position of the stage by adding data of a surface shape of the substrate obtained in advance to the data of the target position, while moving the stage in the scanning direction.

According to the third aspect of the present invention, there is provided a scanning exposure apparatus comprising an optical system which projects a pattern of an original onto a substrate, a stage which holds the substrate and moves in a scanning direction perpendicular to an optical axis of the optical system, a measurement system which measures a position, in a direction of the optical axis, of a second surface region of the substrate, the second surface being apart, in a direction opposed to the scanning direction, from a first surface region of the substrate on the optical axis, and a control system, which performs feedback control of a position of the stage by generating data of a target position, in the direction of the optical axis, of the stage, based on data of a position, in the direction of the optical axis, at which the first surface region is to be placed and data of the position of the second surface region measured by the measurement system, and performs feedforward control of the position of the stage by adding data of a surface shape of the substrate obtained in advance to the data of the target position, while moving the stage in the scanning direction.

According to the fourth aspect of the present invention, there is provided a scanning exposure apparatus comprising an optical system which projects a pattern of an original onto a substrate, a stage which holds the substrate and moves in a scanning direction perpendicular to an optical axis of the optical system, a measurement system which measures a position, in a direction of the optical axis, of a second surface region of the substrate, the second surface being apart, in a direction opposed to the scanning direction, from a first surface region of the substrate on the optical axis, and a control system, which performs feedback control of a position of the stage by generating data of a target position, in the direction of the optical axis, of the stage based on data of a position, in the direction of the optical axis, at which the first surface region is to be placed, and data of the positions of the first and second surface regions measured by the measurement system, and performs feedforward control of the position of the stage by adding data of a surface shape of the substrate obtained in advance to the data of the target position, while moving the stage in the scanning direction.

According to the fifth aspect of the present invention, there is provided a device manufacturing method comprising steps of exposing a substrate using the above-mentioned scanning exposure apparatus, and developing the exposed substrate.

According to the sixth aspect of the present invention, there is provided a scanning exposure method of projecting a pattern of an original onto a substrate through an optical system, while moving a stage holding the substrate in a scanning direction perpendicular to an optical axis of the optical system, the method comprising steps of measuring a position, in a direction of the optical axis, of a surface region of the substrate, and performing feedback control of a position of the stage by generating data of a target position, in the direction of the optical axis, of the stage, based on data of the position of the surface region measured in the measurement step and performing feedforward control of the position of the stage by adding data of a surface shape of the substrate obtained in advance to the data of the target position, while moving the stage in the scanning direction.

According to the seventh aspect of the present invention, there is provided a scanning exposure method of projecting a pattern of an original onto a substrate through an optical system, while moving a stage holding the substrate in a scanning direction perpendicular to an optical axis of the optical system, the method comprising steps of measuring a position, in a direction of the optical axis, of a surface region of the substrate, and performing feedback control of a position of the stage by generating data of a target position, in the direction of the optical axis, of the stage, based on data of a position, in the direction of the optical axis, at which the surface region is to be placed, and data of the position of the surface region measured in the measurement step, and performing feedforward control of the position of the stage by adding data of a surface shape of the substrate obtained in advance to the data of the target position, while moving the stage in the scanning direction.

According to the eighth aspect of the present invention, there is provided a scanning exposure method of projecting a pattern of an original onto a substrate through an optical system while moving a stage holding the substrate in a scanning direction perpendicular to an optical axis of the optical system, the method comprising steps of measuring a position, in a direction of the optical axis, of a second surface region of the substrate, the second surface being apart, in a direction opposed to the scanning direction, from a first surface region of the substrate on the optical axis, and performing feedback control of a position of the stage by generating data of a target position, in the direction of the optical axis, of the stage based on data of a position, in the direction of the optical axis, at which the first surface region is to be placed, and data of the position of the second surface region measured in the measurement step, and performing feedforward control of the position of the stage by adding data of a surface shape of the substrate obtained in advance to the data of the target position, while moving the stage in the scanning direction.

According to the ninth aspect of the present invention, there is provided a scanning exposure method of projecting a pattern of an original onto a substrate through an optical system, while moving a stage holding the substrate in a scanning direction perpendicular to an optical axis of the optical system, the method comprising steps of measuring a position, in a direction of the optical axis, of a second surface region of the substrate, the second surface being apart, in a direction opposed to the scanning direction, from a first surface region of the substrate on the optical axis, and performing feedback control of a position of the stage by generating data of a target position, in the direction of the optical axis, of the stage based on data of a position, in the direction of the optical axis, at which the first surface region is to be placed, and data of the positions of the first and second surface regions measured in the measurement step, and performing feedforward control of the position of the stage by adding data of a surface shape of the substrate obtained in advance to the data of the target position, while moving the stage in the scanning direction.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 8A to 8C are views showing the positional relationship between focus measurement spots, an exposure slit, and a shot to be exposed immediately before scanning exposure and during the exposure;

FIG. 15 is a perspective view showing an example of the approximate plane of the shot surface shape according to the present invention ($Z=C*X*Y$);

FIG. 19 is a view showing an example (example of interpolation with respect to the X-axis) of the procedure for estimating coefficient terms from the positional relationship between sample shots by means of interpolation, extrapolation, or the like;

FIG. 20 is a view showing an example (example of interpolation with respect to the Y-axis) of the procedure for estimating coefficient terms from the positional relationship between sample shots by means of interpolation, extrapolation, or the like;

FIG. 21 is an example of a log which contains a pattern offset measurement result according to the preferred embodiment of the present invention;

DETAILED DESCRIPTION OF THE PREFERRED EMBODIMENTS

As the best mode for carrying out the present invention, an embodiment wherein a substrate serving as an object to be exposed is a semiconductor wafer will be described in detail below with reference to the drawings.

Figure 1:
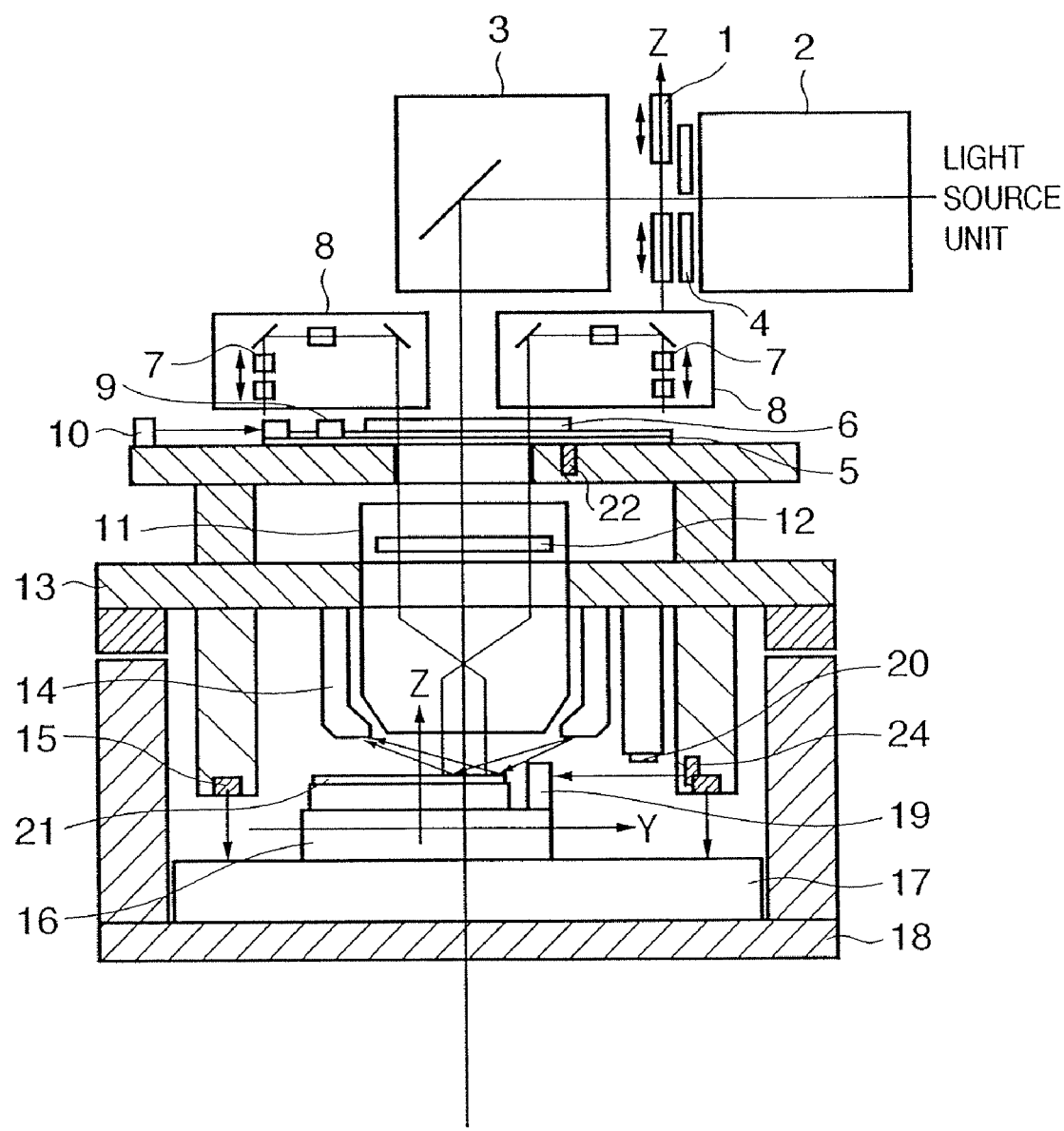
FIG. 1 is a view showing the schematic arrangement of a scanning exposure apparatus according to a preferred embodiment of the present invention.

FIG. 1 is a view showing the schematic arrangement of a scanning exposure apparatus according to a preferred embodiment of the present invention. Exposure light from a light source unit, such as an excimer laser, reaches a slit 4 through a first condenser lens group 2. The slit 4 narrows a light beam of the exposure light to a slit like beam having a dimension of about 7 mm in the Z direction and adjusts the illuminance integrated in the Z-axis direction so as to be uniform across a predetermined range in the X-axis direction. A masking blade 1 tracks the end of the pattern drawing field angle of a reticle (master) 6 in scanning exposure for a reticle stage (master stage) 5 and a wafer stage (substrate stage) 16. The masking blade 1 prevents exposure light from striking a light transmitting portion of the reticle 6 and being projected on a wafer 21, while the reticle stage 5 decelerates after the transfer of the pattern of the reticle 6. Exposure light having passed through the masking blade 1 illuminates the reticle 6 on the reticle stage 5 through a second condenser lens group 3. The exposure light having passed through the pattern of the reticle 6 forms the imaging plane of the pattern near the surface of the wafer (substrate) 21 through a projection lens 11. An NA stop 12 is provided in the projection lens 11 to change an illumination mode in exposure.

One-dimensionally movable TTL (Through The Lens) scopes 8 measure the X-, Y-, and Z-axis positions of alignment marks, respectively, formed on the reticle 6 and on a reference mark 19 on the wafer 21 or wafer stage 16 with respect to the absolute position references of the TTL scopes 8. Relay lenses 7 are used to adjust the focus of the respective TTL scopes 8. By referring to the position of each relay lens 7 when the alignment mark is in best focus, the focus (position in the Z-axis direction) of an object to be detected can be measured. In FIG. 1, two TTL scopes 8 are arranged in the Y direction for illustrative convenience. In practice, still another TTL scope is arranged in the X direction. This arrangement enables measuring tilts in the ωx and ωy directions of the reticle alignment mark and the reference mark 19 on the wafer 21 or wafer stage 16 toward each other. The TTL scopes 8 shown in FIG. 1 can be driven toward the center of the field angle (Y-axis direction).

The reticle stage 5 is controlled in the X, Y, and θ directions by three reticle laser interferometers 10. FIG. 1 shows only one reticle laser interferometer 10. In practice, however, two reticle laser interferometers 10 are arranged in the Y axis direction, and one reticle laser interferometer 10 is arranged in the X-axis direction. The reticle stage 5 is movable in the X, Y, and θ directions along a guide arranged on a lens barrel surface plate 13. The reticle stage 5 can move over a long stroke in the Y-axis direction for scanning in synchronism with the wafer stage 16. The reticle stage 5 can move in the X- and θ-axis directions only within a small range to eliminate a positional error generated when the reticle stage 5 chucks the reticle 6. The exposure apparatus has a structure, which escapes a reaction force generated upon driving the reticle stage 5 to a reaction force absorption device (not shown) rigidly connected to a base plate 18. The lens barrel surface plate 13 does not shake against a driving reaction. A reticle reference plate 9 is mounted on the reticle stage 5. A mark, which can be observed by the TTL scopes 8, is drawn on the reticle reference plate 9.

Reference numeral 14 denotes a focus detector. When an object to be measured is obliquely irradiated with measurement light emitted from a light emitting device, such as a laser diode, the position of a reflected light spot on the light receiving side varies depending on the position in the focus direction of the object to be measured. Thus, the focus value (substrate surface position in the focus direction), at a location of the wafer surface where the measurement light is projected, is obtained by measuring the barycentric position of the reflected light spot on the light-receiving side.

The focus detector 14 measures the Z, ωx, and ωy positions of the wafer 21 or reference mark 19 on the wafer stage (substrate stage) 16 at a high speed regardless of the presence/absence of the mark, without the mediacy of the projection lens 11. The focus detector 14 is used to detect the focus (substrate surface position) when exposure is performed, while synchronously scanning the reticle stage 5 and wafer stage 16. To guarantee the long-term stability of the measurement precision, the focus detector 14 performs self calibration by comparing the result of measuring the reference mark 19 on the wafer stage 16 by the TTL scopes 8, with the result of measuring the reference mark 19 by the focus detector 14.

An off-axis scope 20 has a single lens focus measurement function and an X/Y-direction alignment error measurement function. To align the wafer in a general mass production job, the off-axis scope 20 performs global tilt measurement and global alignment measurement. The global tilt correction and global alignment correction are simultaneously performed when the wafer stage 16 is so stepped as to position an exposure area of the wafer below the projection lens 11.

The lens barrel surface plate 13 serves as a base for attaching the high-precision measurement device of the exposure apparatus. The lens barrel surface plate 13 is positioned to slightly levitate above the base plate 18 directly set on the floor. Since the above-described focus detector 14 and TTL scopes 8 are attached to the lens barrel surface plate 13, measurement values of these measurement devices eventually represent relative distances from the lens barrel surface plate 13. An inter surface plate laser interferometer 15 measures the relative positional relationship between the lens barrel surface plate 13 and a stage surface plate 17. In the first embodiment, control (to be described with reference to FIG. 6) is performed such that the sum of a measurement result from the inter-surface-plate interferometer 15 and that from a triaxial Z sensor (not shown) mounted on the wafer stage 16 coincides with a target value designated from the host sequence. With this operation, the wafer 21 on the wafer stage 16 is kept with respect to the lens barrel surface plate 13 so as to coincide with the target value designated from the host sequence in the focus direction. Similar to the interferometers for the reticle 5, three wafer stage interferometers 24 are arranged and used to control the wafer stage 16 in the X, Y, and θ directions.

The stage surface plate 17 is positioned to slightly levitate from the base plate 18, similar to the lens barrel surface plate 13. The stage surface plate 17 has a function of removing vibrations transmitted from the floor to the wafer stage 16 through the base plate 18, and a function of suppressing a reaction force upon driving the wafer stage 16 and escaping the reaction force to the base plate 18. The wafer stage 16 is mounted above the stage surface plate 17 by slightly levitating from it.

A reticle focus measurement unit 22 measures the position in the focus direction of a pattern drawing surface of the reticle 6, which is chucked and held on the reticle stage 5. As for the reticle focus measurement unit 22, a plurality of measurement points are arranged vertically with respect to the sheet surface of FIG. 1. The reticle focus measurement unit 22 adopts, as a measurement scheme, measurement of the barycentric position of reflected light, like the focus detector 14. When the reticle stage 5 moves in the Y direction, which allows position measurement by the reticle laser interferometers 10, the reticle pattern surface can undergo focus measurement at an arbitrary position in the Y direction.

The obtained focus measurement information of the reticle surface is stored in a storage device (not shown) and is used to correct the target position locus in the focus and tilt directions of the wafer stage 16, which performs a scan operation in exposure of the wafer 21.

Figure 2:
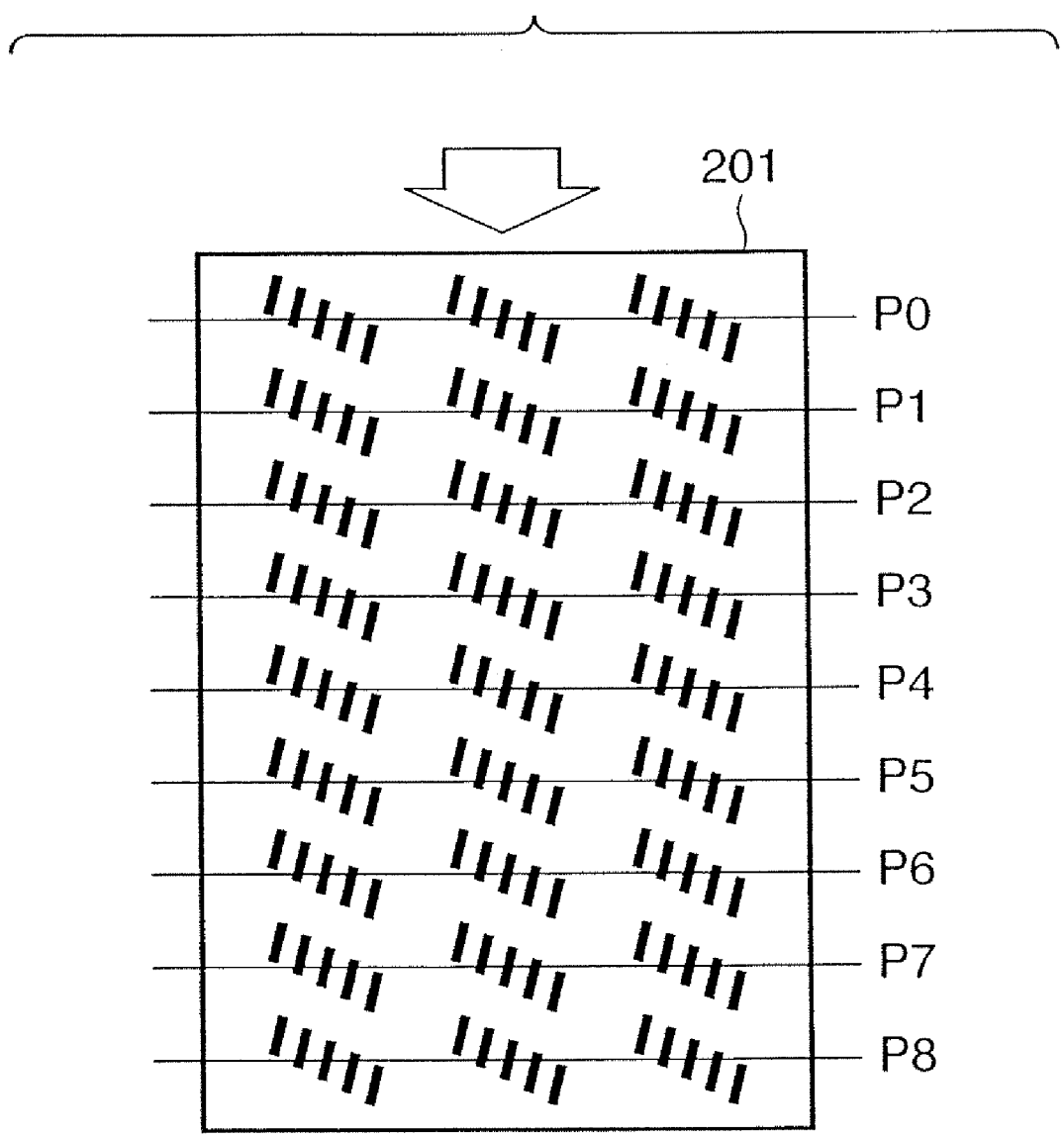
FIG. 2 is a view showing the layout of focus measurement positions and focus measurement spots within a shot during scanning exposure.

FIG. 2 is a view showing the layout of focus measurement points within an exposure shot 201 when the exposure shot 201 is to undergo scanning exposure with the scanning exposure apparatus in FIG. 1.

Figure 3:
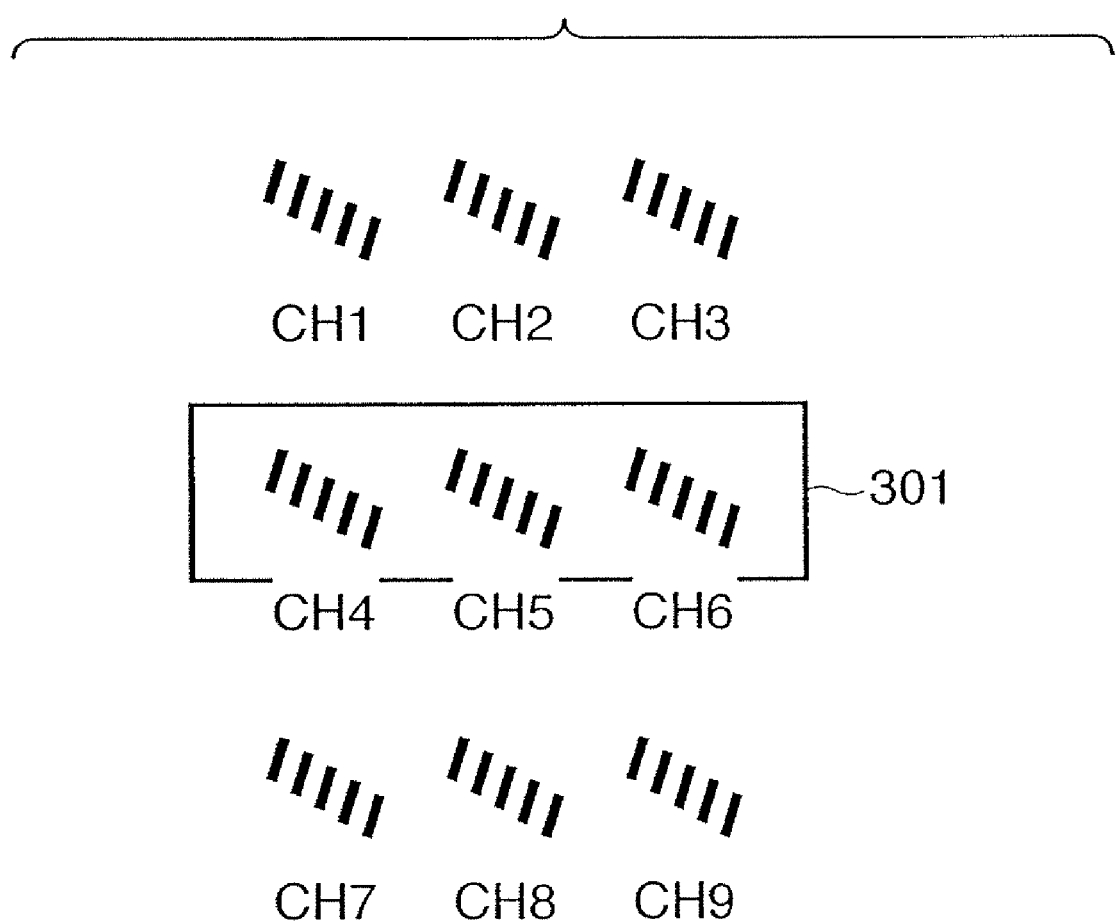
FIG. 3 is a view showing positions to be irradiated with respective focus measurement spots and the position on a shot of an exposure slit fixed to the main body of the scanning exposure apparatus according to the preferred embodiment of the present invention.

FIG. 3 is a view showing the irradiation positions of respective focus measurement spots and the position on the exposure shot 201 of an exposure shot 301 fixed on the main body of the scanning exposure apparatus according to this embodiment.

Referring to FIG. 3, when the wafer is scanned downward with respect to the sheet surface of FIG. 3 during scanning exposure, channels CH1, CH2, CH3, CH4, CH5, and CH6 are used as sensors for focus control information. Channels CH7, CH8, and CH9, and the channels CH4, CH5, and CH6 are used to scan the wafer in the reverse direction.

For the sake of descriptive simplicity, assume that the scanning direction in scanning exposure in this embodiment is the Y-axis direction and that the wafer stage can be driven to an arbitrary position in the X-Y plane and can also be driven in the focus direction (Z direction) of the projection lens. The sensors CH1, CH2, and CH3, and sensors CH7, CH8, and CH9 in the respective scanning directions, can perform focus measurement before the exposure slit exposes an exposure area on the wafer, and, thus, will be referred to as prefocus sensors. The channels CH4, CH5, and CH6, which are focus sensors arranged at a slit position, will be referred to as slit sensors. Each channel comprises a plurality of focus measurement marks, and the average value of measurement values of the respective marks serves as a focus measurement value of each channel. Focus measurement values for three channels are obtained from the prefocus sensors CH1, CH2, and CH3, and the coordinate values (substrate surface positions) in the Z and ωy-axis directions at the prefocus sensor measurement positions are calculated from these values and known distances between channels. The coordinate values are made available as data for focus control. The same applies to measurement values from the slit sensors CH4, CH5, and CH6 and those from the prefocus sensors CH7, CH8, and CH9. Focus measurement during scanning exposure is performed a plurality of numbers of times per one shot. FIG. 2 shows an example wherein focus measurement points P0 to P8 are arranged with 4-mm pitches in the exposure shot 201 of a standard size (for example, the current standard is 26 mm×33 mm) in the scanning exposure apparatus. In this embodiment, the layout span for the prefocus sensors and slit sensors is set at 12 mm. Each slit sensor can follow a place, which has previously been measured, by its adjacent prefocus sensor with a three-cycle delay. The exact position of a light projecting spot of focus measurement light of each of the channels CH1 to CH9 is slightly shifted from a design value due to processing dimension tolerances of a prism element mounted in the focus detector 14, or the like. This shift is reflected in a correction amount when focus control and exposure are performed for a specified shot (coordinates) on the wafer serving as an object to be exposed, and it is determined whether a measurement spot is located on the wafer. In FIG. 2, the upper portion of the wafer is observed. Focus measurement points are defined as <P0>, <P1>, . . . , <P8> in the passage order of the exposure slit. When the shot falls over the end of the wafer, a focus measurement unit (mark, channel, or point) located in a prohibited area outside the wafer or around the wafer is disabled on the basis of the above-mentioned determination, and focus measurement is prohibited in the disabled measurement unit.

Figure 4:
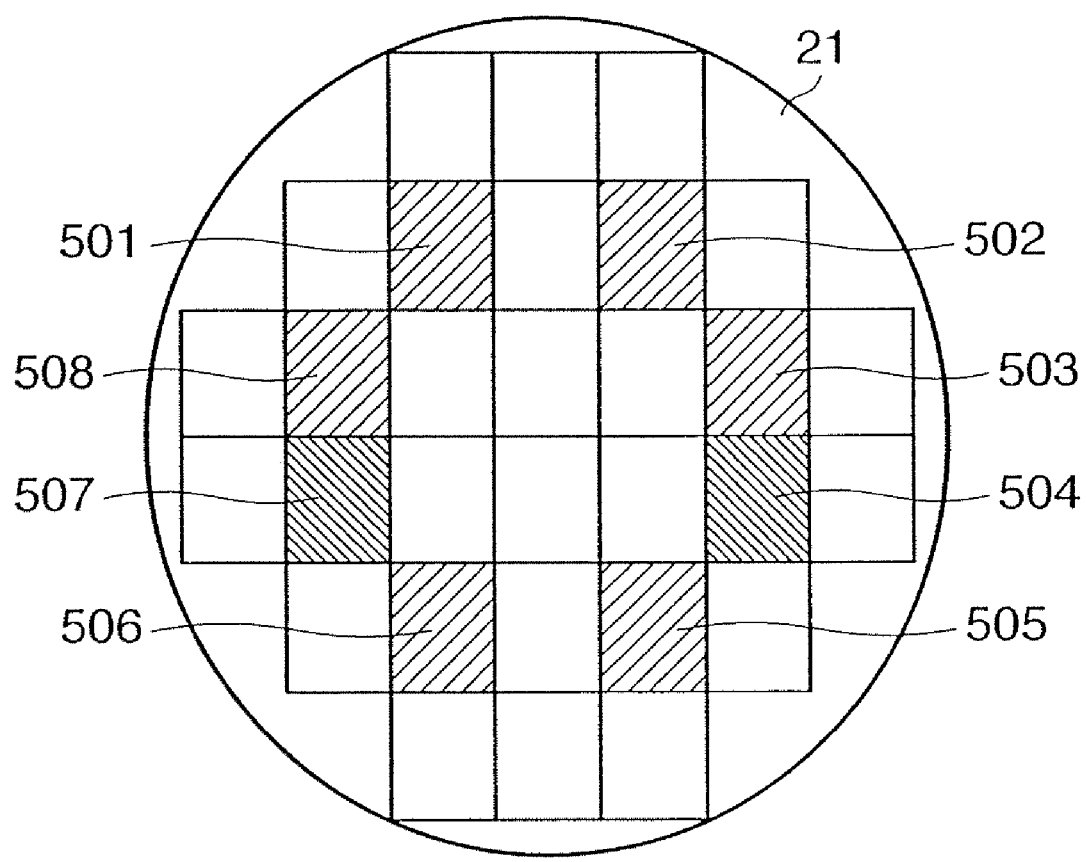
FIG. 4 is a view showing an example of the layout of sample shots (501 to 508) for measuring the pattern offset of a processed wafer 21.

FIG. 4 is a view showing an example of the layout of sample shots for measuring the pattern offset of the wafer 21 having been processed. The shots 504 and 508 also serve as sample shots for prealignment measurement. In pattern offset measurement, measurement scanning is performed for the sample shots 501 to 508 vertically with respect to the sheet surface of FIG. 4. As the measurement order of the sample shots 501 to 508, an order so optimized as to minimize the total time required for the measurement sequence is calculated and prepared.

Figure 12:
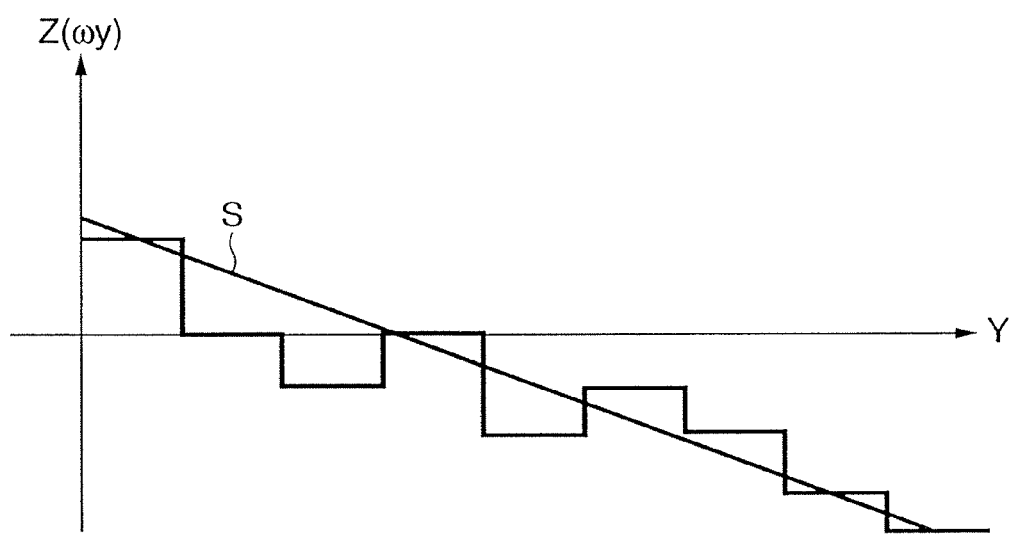
FIG. 12 is a graph representing an example of a measurement value obtained by pattern offset measurement in a predetermined sample shot.

FIG. 12 is a graph showing an example of a measurement value obtained by pattern offset measurement. In scanning in a direction indicated by an arrow shown in FIG. 2, measurement data from the sensors CH7 to CH9 and sensors CH4 to CH6 at the measurement points P0 to P8 (corresponding in number to the number of the measurement points) are obtained and immediately converted into measurement values of Z and ωy components of the sensors. In scanning in a direction opposite to the direction indicated by the arrow shown in FIG. 2, measurement data of the sensors CH1 to CH3 and sensors CH4 to CH6 are obtained in the same manner. The example in the line graph of FIG. 12 plots an example of measurement values in the Z-axis direction from the sensors CH1 to CH3. The same applies to the remaining sensors and control axes. In pattern offset measurement, focus (surface position) measurement is performed while a stage is scan driven without focus tracing driving. Measurement data sequences corresponding in number to the specified sample shots in FIG. 4 are obtained, and the line profile in FIG. 12 is obtained by averaging the measurement data for each of the measurement points P0 to P8. The profile depends on a difference obtained by averaging differences among a plurality of sample shots between the surface position of the stage movement in the Z direction and the wafer pattern surface position when the stage is scanned. When the representative plane function S (approximate plane of the shot surface shape) is assumed to be the average plane (approximate plane) of a line profile, the function is obtained as a least square approximation for a linear function (linear polynomial). The slope of the representative plane function is used as a correction coefficient 901 (to be described later). The representative plane function is not limited to a linear function and may be a high-degree polynomial. The focus control precision increases along with an increase in degree of a polynomial or the number of terms.

Figure 13:
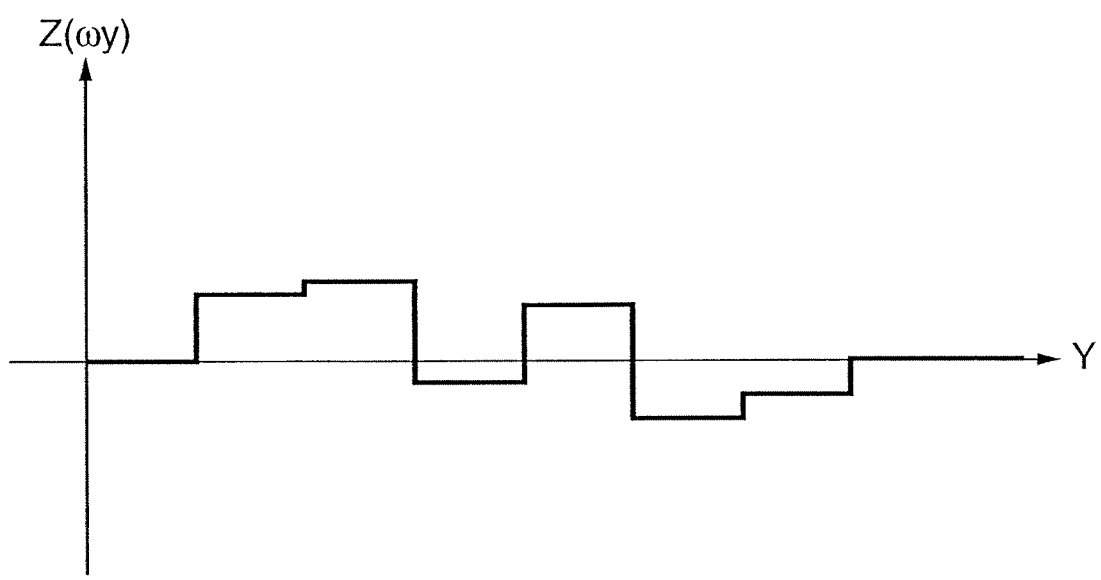
FIG. 13 is a graph representing a pattern offset correction amount obtained by subtracting an approximate plane of a shot surface shape from the measurement value of FIG. 12.

FIG. 13 is a graph showing the pattern offset as a difference between the measurement value in FIG. 12 and the representative plane function S. The data rows in FIG. 13 are reflected in a pattern offset correction table 916 (to be described later). More specifically, a correction amount allowed for the pattern offset correction table 916 is considered as projections and recesses caused by a fine circuit pattern formed as an underlying layer of the wafer. The projections and recesses are not tracked by changing the target value of the wafer stage during scanning exposure.

Figure 5:
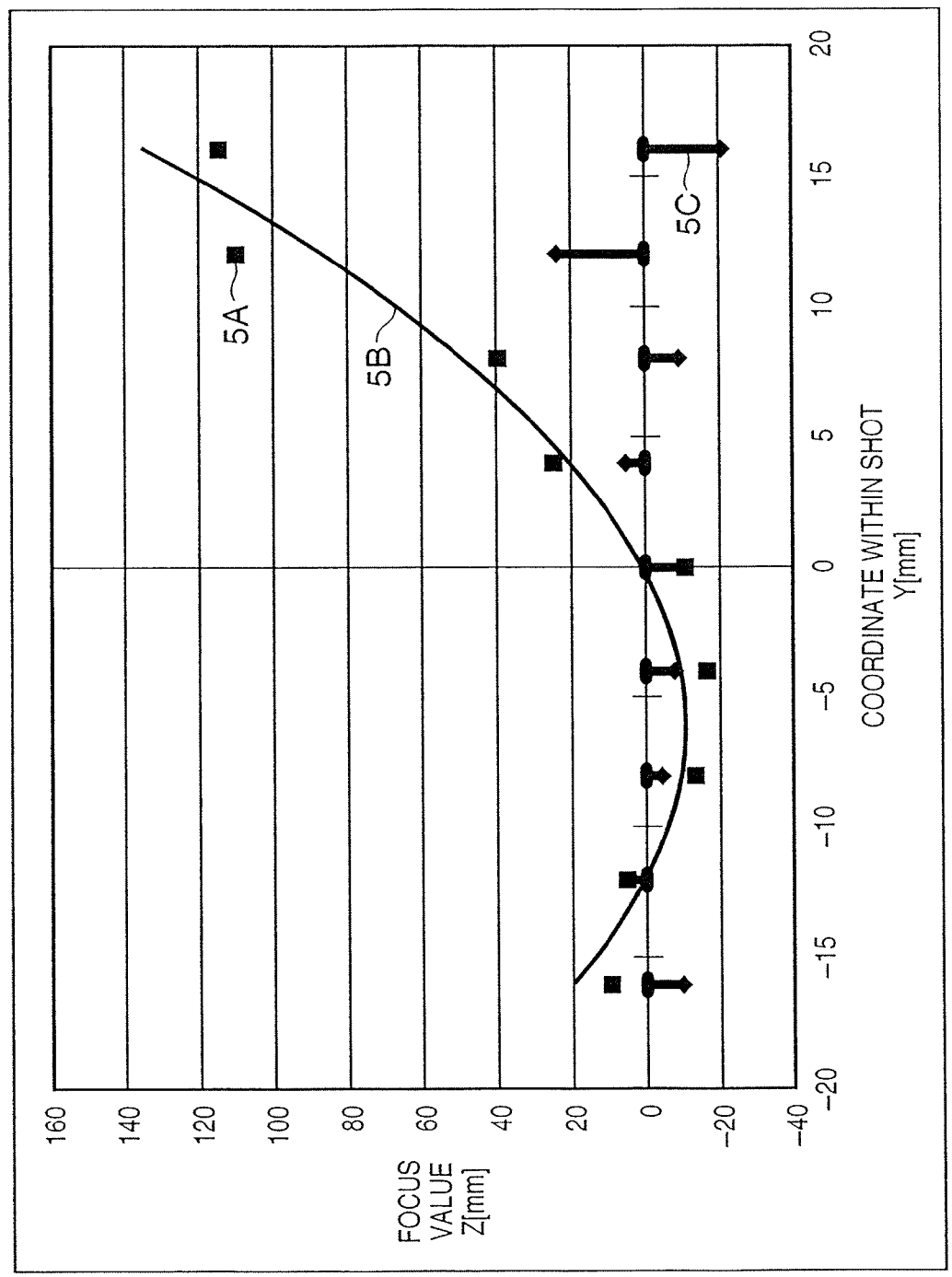
FIG. 5 is a graph showing an approximate example wherein a representative plane function (approximate curved surface of the function) S described with reference to FIG. 4 is a quadratic polynomial.

FIG. 5 shows an example wherein the representative plane function S described with reference to FIG. 12 is a quadratic polynomial. Reference numeral 5A denotes measurement values at pattern offset measurement points within a shot; 5B, a polynomial function representing a quadratic representative plane (approximate plane obtained by a quadratic polynomial) that pertains to 5A; and 5C, pattern offset data (difference data between the measurement value 5A and approximate plane 5B of a shot surface shape) reflected in the pattern offset correction table 916 (see FIG. 9).

FIGS. 14 to 17 show examples of a shot surface shape, which can be obtained when the representative plane function S is a function whose degree is two or less.

Figure 14:
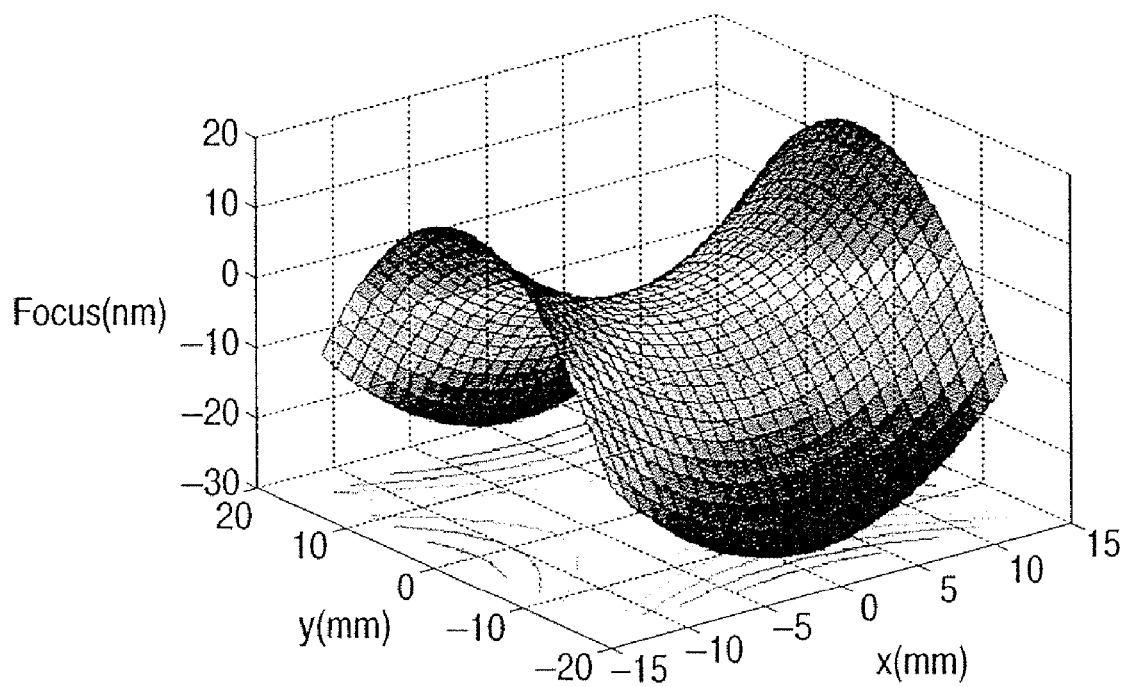
FIG. 14 is a perspective view showing an example of an approximate plane of a shot surface shape according to the present invention ($Z=A*X^2+B*Y^2$)
Figure 16:
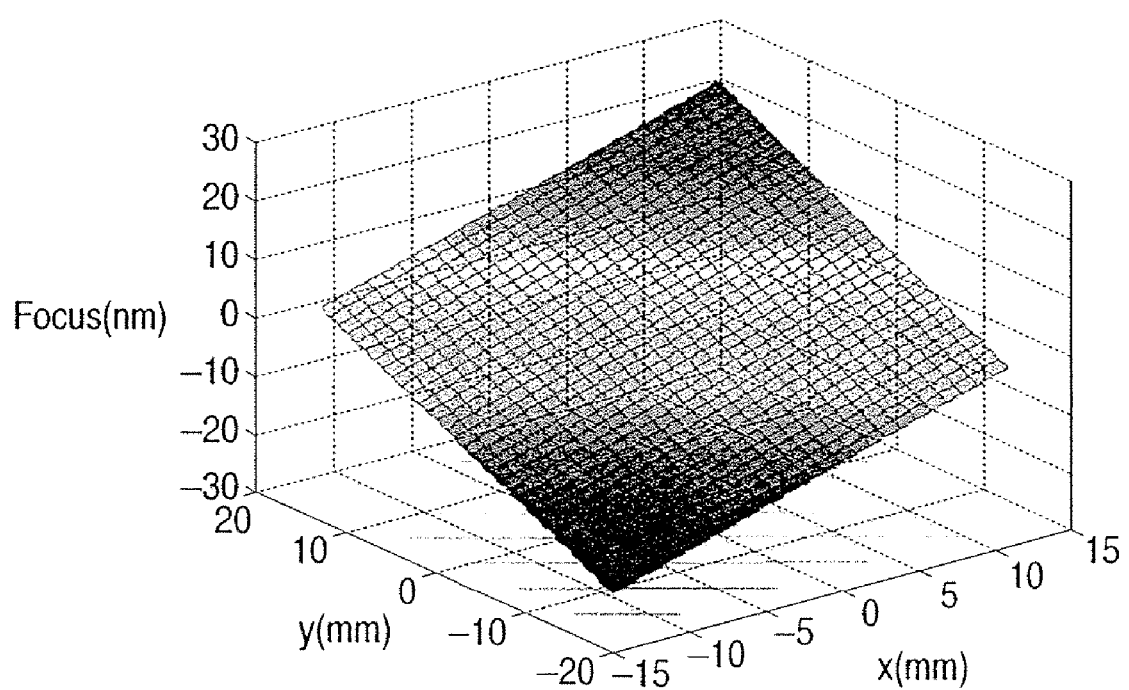
FIG. 16 is a perspective view showing an example of the approximate plane of the shot surface shape according to the present invention ($Z=D*X+E*Y$)
Figure 17:
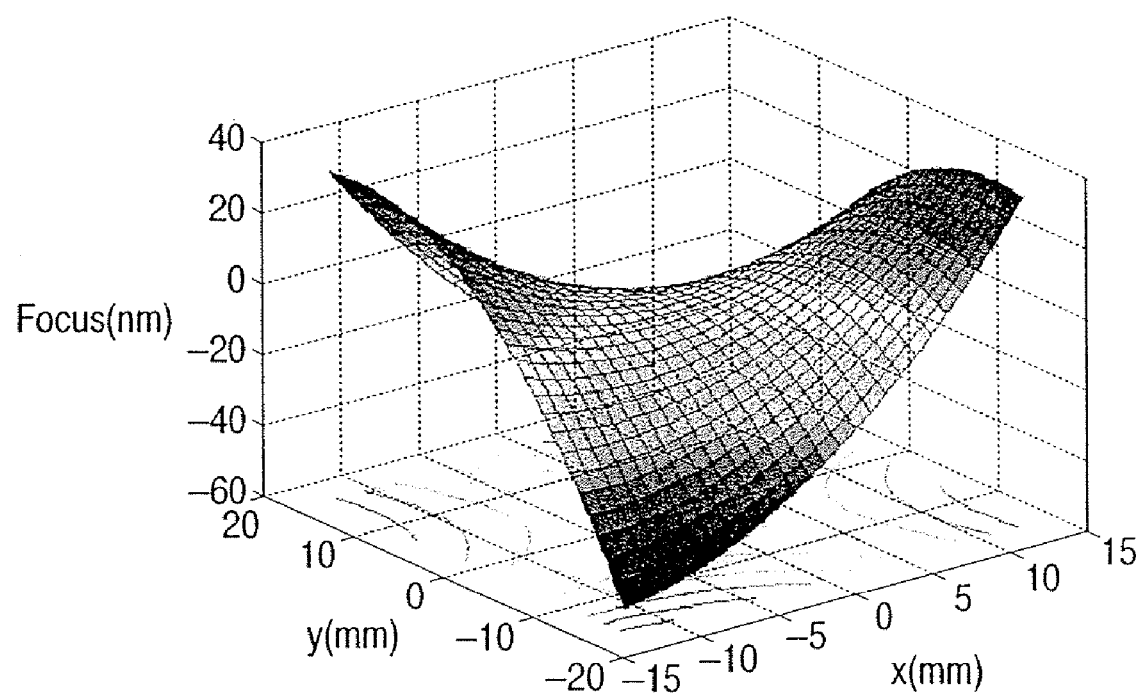
FIG. 17 is a perspective view showing an example (example obtained by combining FIGS. 14 to 16) of the approximate plane of the shot surface shape according to the present invention.

A curved surface as shown in FIG. 14 can be formed when the ratio of expansion due to the wafer process varies within a wafer surface. A curved surface as shown in FIG. 15 can be formed when a foreign substance is caught between the wafer chuck and a support base for the wafer chuck, when a flat work error is large on the back surface of the wafer chuck, or the like. Since a shot curved surface shape caused by a factor that pertains to an apparatus such as a wafer chuck does not depend on the job, machine-specific correction parameters may separately be prepared. A sloped surface as shown in FIG. 16 can be formed when the precision of global tilt measurement 1008 (see FIG. 10) to be performed before pattern offset measurement is poor, when the wafer surface shape is nonuniform, or the like. FIG. 17 shows a shape example obtained when the above-mentioned factors are combined. These shot surface shapes are desirably corrected on the basis of a factor which deteriorates the wafer surface shape. As for parts which are hard to process or which are expected to be frequently replaced with one another, it is advantageous in terms of a reduction in parts cost and management to compensate for the distorted shape caused by measurement using software in exposure.

Figure 6:
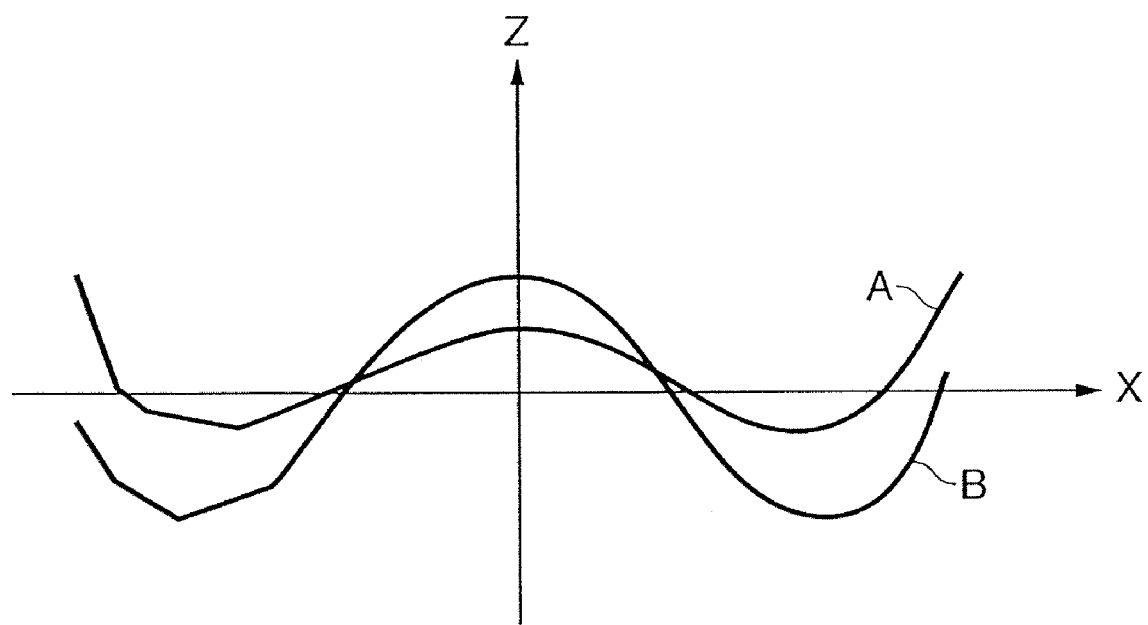
FIG. 6 is a graph showing an example of a projection lens image plane correction method to be executed when the representative plane function S has a quadratic curvature in the X direction.

FIG. 6 shows a specific example of a correction method when the representative plane function S has a quadratic curvature in the X direction. Reference symbol A denotes the image plane of the projection lens 11 when the quadratic component correction amount is zero. Reference symbol B denotes the image plane when the quadratic component correction amount has a value other than zero. The best focus shape of the image plane of the projection lens 11 can be changed by changing the positions of a plurality of lenses (not shown) within the projection lens 11.

Figure 7:
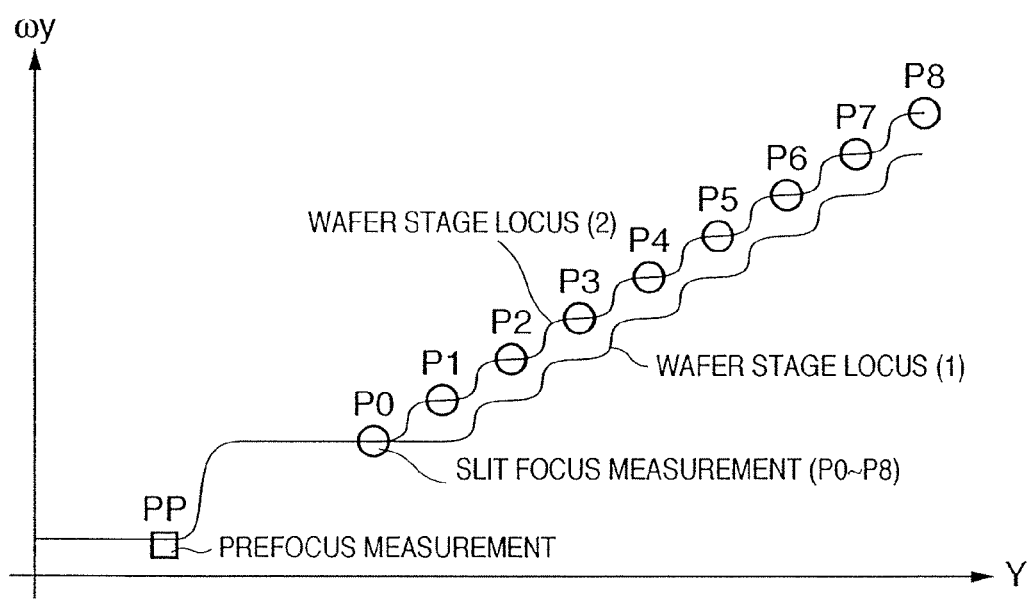
FIG. 7 is a conceptual graph showing the locus of a wafer surface when the wafer surface is driven to a target position in accordance with a focusing sequence.

FIG. 7 is a conceptual view showing the sequence of driving the wafer stage 16 with respect to the wafer surface measured by the focus detector 14 and performing focusing in focus (and tilt) control during exposure.

FIGS. 8A to 8C are views showing shots on the wafer, the focus measurement positions CH1 to CH9, exposure slit 301, and a scanning direction (arrow) for explaining characteristic phases in focus (and tilt) control.

When scanning exposure is performed in the scanning direction indicated by the arrow in FIG. 2, the sensors CH1 to CH3 can perform focus measurement for an exposure area within the shot before the exposure shot 301 comes to the exposure area (FIG. 8A). Focus measurement at this time will be referred to as prefocus measurement PP hereinafter. The required driving amounts in the Z and ωy directions are calculated on the basis of a measurement value obtained by prefocus measurement. The driving profile of the substrate surface (a curve from PP to P0) for eliminating differences between the focus and tilt amounts measured by PP and their target values before the slit sensors CH4 to CH6 reach points for focus measurement is generated as the target locus in the Z- and ωy-axis directions of the wafer stage. If the position in the Z- and ωy-axis directions of the wafer surface is parallel to the plane of the origin of the focus detector 14, it is confirmed that the wafer surface position coincides with the desirable control target value when the scan exposure phase reaches P0 and the slit sensors perform measurement, as shown in FIG. 8B. In this embodiment, adjustment is so performed as to make the origin plane of the focus detector 14 parallel to movement of the wafer stage (origin plane) by a calibration sequence, before the exposure processing sequence.

In a wafer stage locus (1) in FIG. 7, when an exposure phase comes to P0, control logic calculates a difference between a measurement result of the wafer surface shape from the slit sensors CH4 to CH6 and the desirable control target value and generates a profile, which eliminates the calculated difference before measurement of the next focus measurement point P1. The control logic repeats this operation until the exposure phase reaches the last measurement point P8 of the exposure shot shown in FIG. 8C. As for the measurement point P0, since the difference between a focus measurement value at the position P0 from the slit sensors and the focus target value at PP obtained by the prefocus sensors is eliminated, the focus measurement value is calculated as zero, i.e., it is determined that there is no need to correct the focus target value of the stage in the next driving. The shot surface is inclined, and a deviation from the focus target value corresponding to (inclination of shot)×(focus measurement pitch) occurs before the exposure phase reaches the next measurement point P1. Although stage driving is so performed at the point P2 as to eliminate the deviation measured at P1, a new deviation generated when the exposure phase moves from the point P1 to the point P2 is not eliminated. If the surface shape after the pattern offset of a shot to be exposed has been removed has the shape of a ramp function or exhibits a change of a higher degree, the shape of the driving locus of the wafer stage or shot surface follows with the delay of one measurement pitch, and a steady state deviation from the desirable focus target value cannot be eliminated. To perform focus control, in the present invention, only slit sensors are used as focus sensors to be referred to during focus control during shot exposure. A prefocus sensor may be employed instead. With this method, the steady state deviation can be suppressed, but it is difficult to substantially eliminate the steady state deviation.

Under the circumstances, in a pattern offset measurement sequence, the shot surface shape is considered not as a flat surface, but as a curved surface represented by a high-degree polynomial function, and an alienation between the curved surface and the measurement value (position) for each focus measurement unit (channel) is reflected in the pattern offset correction table 916 as pattern offset data. A polynomial curved surface function obtained in calculating the approximate plane of the shot surface shape is substituted into a correction coefficient 901 (see FIG. 9) (to be described later), and the control target value of the wafer stage and the current focus position are separately added to the correction coefficient, thereby performing feedforward control. As a result, the locus of the wafer stage is plotted like a wafer stage locus (2), and the tracking performance is increased with respect to the shot surface shape.

Figure 9:
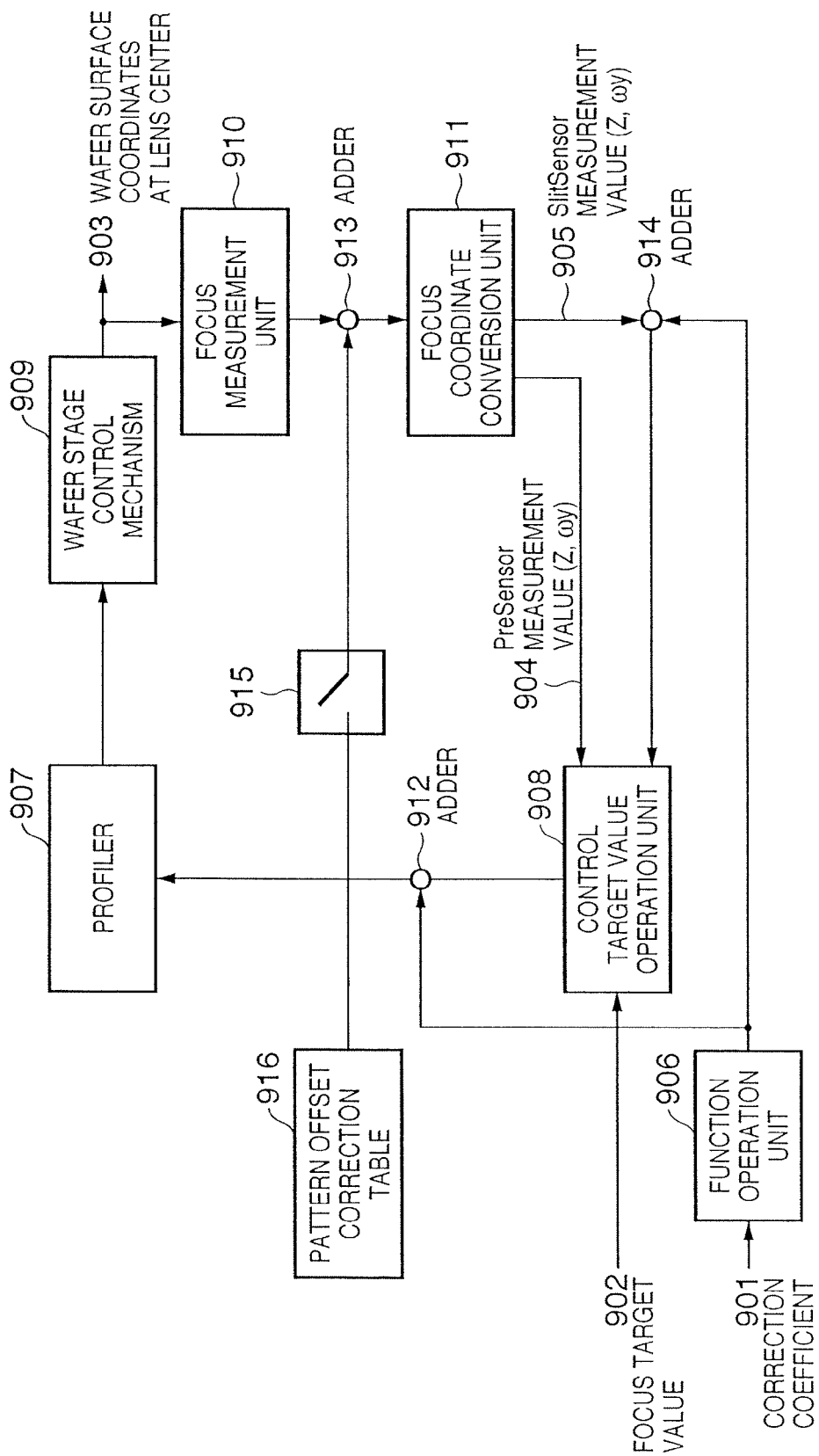
FIG. 9 is a functional block diagram of a focus control mechanism to which the present invention is applied.

FIG. 9 is a functional block diagram of a focus control mechanism to which the present invention is applied. Reference numeral 901 denotes a coefficient which determines the above-mentioned polynomial curved surface function. The coefficient 901 is loaded into a function operation unit 906 to calculate a profile having an approximately curved surface according to the stage Y coordinate during exposure. Reference numeral 902 denotes a focus target value. A target value for a focus measurement unit standard in the Z-, ωx-, ωy-axis directions optimum for a lot to be processed is supplied from an operator or an external online host. Reference numeral 908 denotes a control target value operation unit, which calculates as a target value for each measurement point the driving amount to the next focus measurement point using the focus target value 902, a prefocus sensor measurement value 904, and a slit sensor measurement value 905. An approximate value (Z, ωy) of the shot surface shape in accordance with the Y coordinate calculated by the function operation unit 906 is added to the current position of the slit sensor (a measurement value 905 from the slit sensor) output from a focus coordinate converter 911 at an adder 914 and the target value for each stage measurement point at an adder 912. A profiler 907 sequentially generates a target value for each servo sample clock such that the position in the Z-, ωx-, and ωy-axis directions of the wafer stage reaches the target value output for each measurement point from the adders 912 to 914 by the next focus measurement point while plotting a smooth locus. A wafer stage control mechanism 909 controls the wafer stage in real time such that a difference between the target value and the current position of the stage measured by an interferometer 24 or the like becomes zero for each servo clock. Reference numeral 910 denotes a focus measurement unit, which comprises a prefocus sensor and a slit focus sensor. The focus measurement unit performs focus measurement of each shot of the wafer mounted on the wafer stage under the projection lens. Reference numeral 916 denotes a pattern offset correction table which stores pattern offset data for correcting the measurement value for each focus measurement spot. Reference numeral 915 denotes a switch 915 for turning on/off pattern offset correction. To perform pattern offset measurement scan, the switch 915 is turned off to set the pattern offset correction table 916 in the cutoff state. To perform exposure, the switch 915 is turned on to add the pattern offset data in the pattern offset correction table to a measurement value from the focus measurement unit 901 by the adder 913. Reference numeral 911 denotes a focus coordinate converter which converts position data in the Z direction for each focus measurement unit at a prefocus position and slit sensor position from the adder 913 into data in the Z and ωy coordinates.

Figure 10:
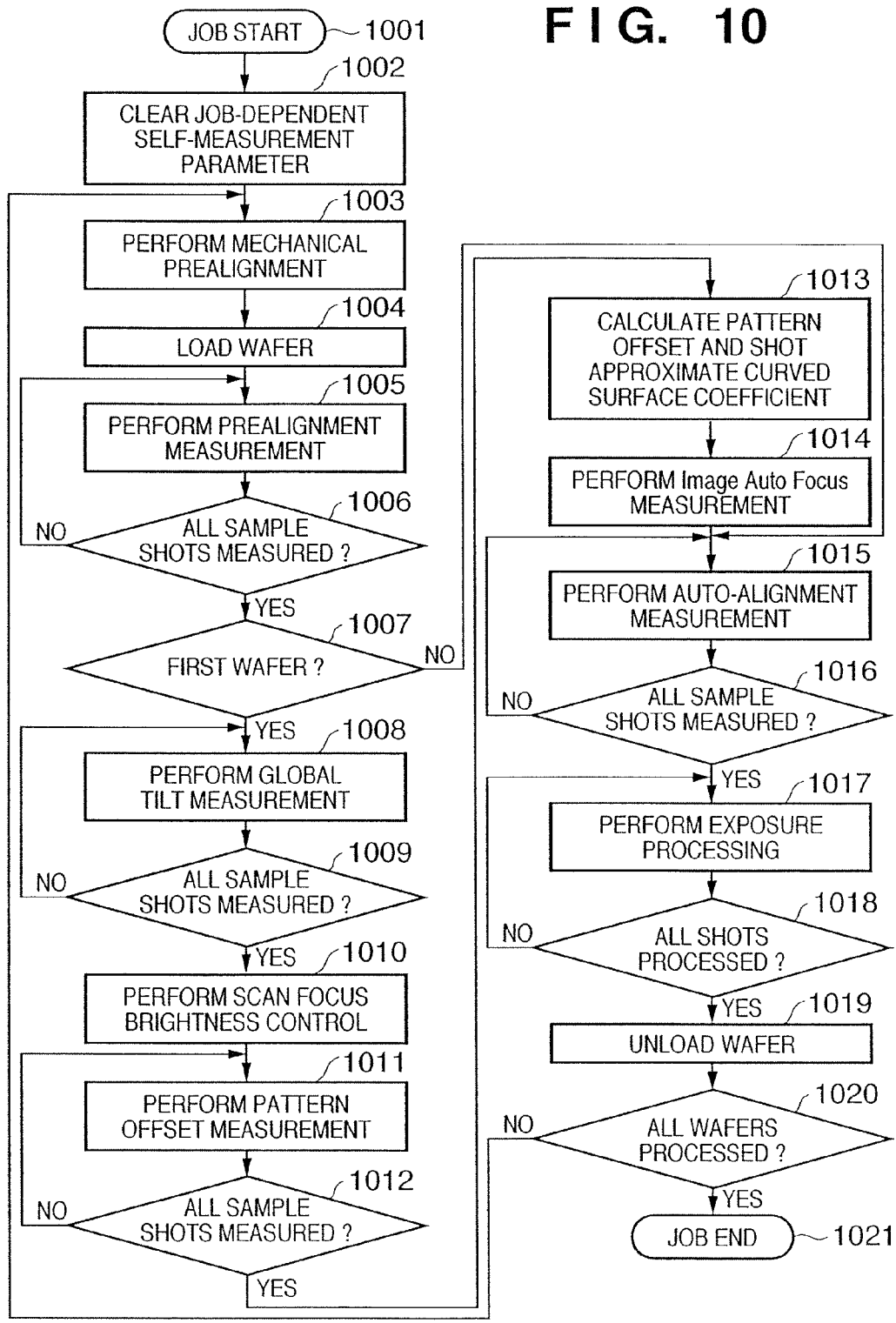
FIG. 10 is a flowchart showing an example of a wafer exposure sequence according to the preferred embodiment of the present invention.

FIG. 10 is a flowchart showing an example of a wafer exposure sequence according to the preferred embodiment of the present invention. A job designated from an operator or on line host starts (step 1001). Job-dependent measurement parameters, including pattern offset data, the brightness control value for the focus measurement unit, and the best focus position of an alignment mark, are cleared (step S1002). Before a wafer is mounted on a wafer stage during wafer loading, an orientation flat or notch formed in the wafer is measured by a mechanical pre-alignment system (not shown), thereby performing mechanical pre-alignment, i.e., roughly adjusting the rotational position and central position of the wafer (step 1003). The wafer is loaded onto the wafer stage by a transport robot (not shown) (step 1004). The flow shifts to a pre-alignment measurement loop in which the pre-alignment mark of a pre-alignment sample shot such as the shot 504 or 507 in FIG. 4 is measured (steps 1005 and 1006). If the wafer to be processed is the second or later one, the pattern offset value and Image Auto Focus measurement value obtained for the first wafer can also be used, and parameter measurement can be skipped.

Steps 1008 and 1009 constitute a global tilt measurement loop. In the measurement loop, the shot centers of the pattern offset measurement sample shots 501 to 508 are measured only with a single-lens, i.e., CH5, and a least square approximate plane (also referred to as a global tilt plane) is obtained from the central positions (X and Y coordinates) of the respective shots and positions defined by a measurement result of the focus (Z coordinates). Step 1010 is a scan focus brightness control sequence. As for one of the shots indicated by 501 to 508, Y scan is performed while the wafer is aligned on the global tilt plane. The light emission intensity on the light projecting side of the focus measurement unit is adjusted such that the intensity of measurement light obtained during the scan has a light amount value enough to satisfy desired precision. Steps 1011 and 1012 constitute a pattern offset measurement loop in which pattern offset measurement is performed in a predetermined scanning direction for the shots 501 to 508 designated as pattern offset measurement sample shots. The target values in the X-, ωx, and ωy-axis directions of the wafer stage are fixed such that the above-mentioned global tilt plane becomes horizontal. Focusing using the focus sensor described with reference to FIG. 9 is not performed in the pattern offset measurement loop.

Step 1013 is a sequence for calculating the pattern offset correction table and shot approximate plane coefficient, and will be described later in detail with reference to FIG. 11. Step 1014 is an Image Auto Focus measurement sequence in which the best focus position of each alignment mark in a plurality of alignment measurement sample shots (not shown) is obtained. Steps 1015 and 1016 constitute an auto alignment measurement loop, and the second or later wafer passes through this loop to perform alignment measurement.

Steps 1017 and 1018 constitute an exposure processing loop in which the wafer is exposed simultaneously with focus control (driving of the wafer so as to align a shot surface to be exposed of the wafer with a pattern imaging plane). In the exposure processing loop, the pattern offset correction table and shot approximate plane coefficient calculated in step 1013 are reflected in the focus control. The wafer having undergone exposure is unloaded, is recovered by a transfer system, and is sent to the next development step (step 1019). When a certain number of wafers (the number is previously designated in the job) is all processed (step 1020), the job ends (step 1021).

Figure 11:
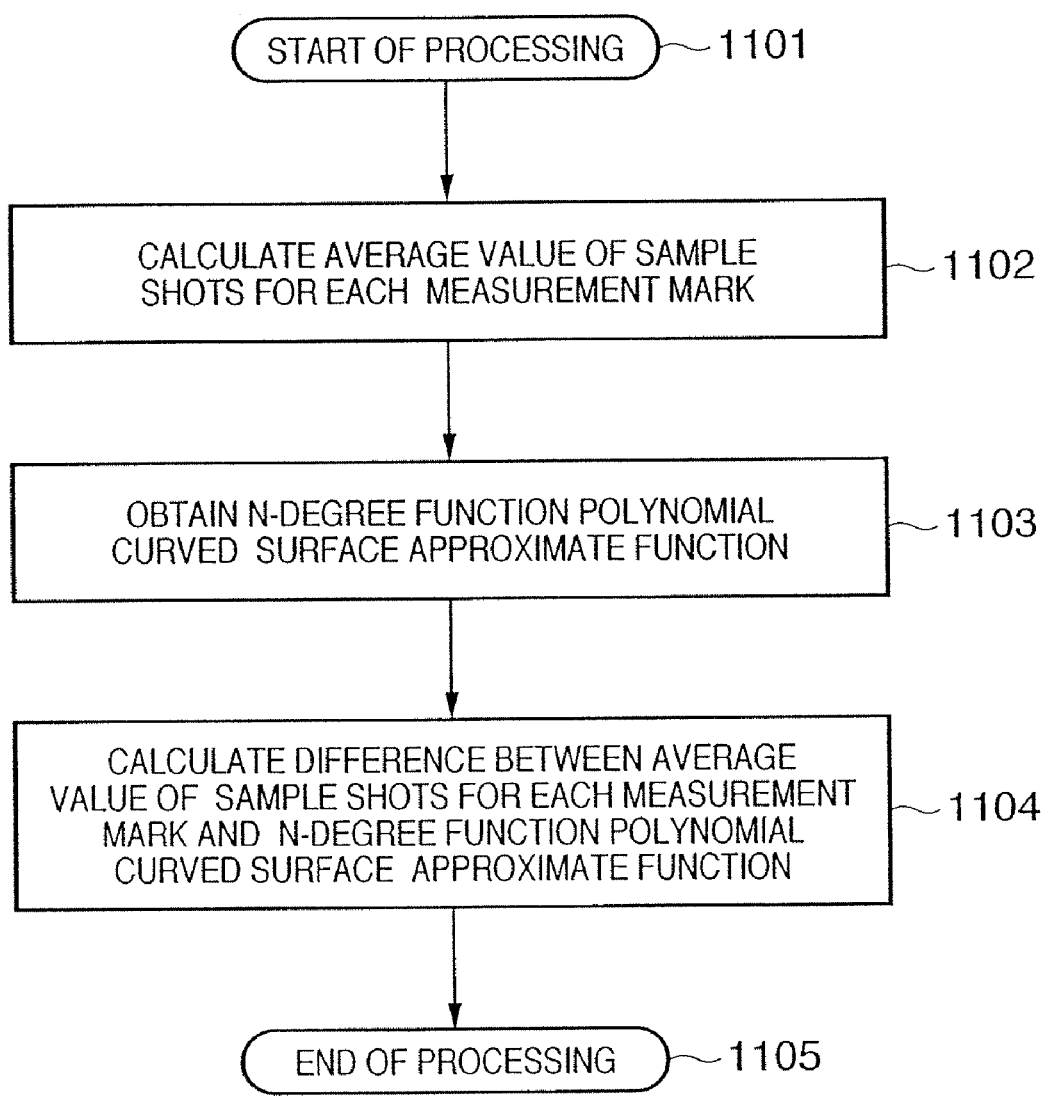
FIG. 11 is a flowchart showing the detailed procedure of a step of calculating a pattern offset and an approximate curved surface coefficient of a shot according to the preferred embodiment of the present invention.

FIG. 11 is a flowchart showing the detailed procedure of the step of calculating the pattern offset data and shot approximate plane coefficient (step 1013, described above) according to the first embodiment of the present invention. In step 1102, the average value of measurement values for each mark (each measurement spot or measurement position), which are obtained at a single position within each pattern offset measurement sample shot, is calculated for each scanning direction. This calculation may be performed using a method of obtaining, for each mark (measurement position), the z-intercept of a mean square plane generated on a plurality of measurement values in the Z direction corresponding to a single position (positions in the X and Y directions), as disclosed in a conventional example. The number of shot surface shape data (position data in the Z direction) calculated for each mark is (number of marks within a shot shown in FIG. 2)×(number of scanning directions) (more specifically, 9×3×5 (135 marks/direction)×2 (direction)=270 (marks)).

In step 1103, the shot shape data obtained in step 1102 undergoes approximation by a method of least squares using a polynomial with a predetermined degree or predetermined number of terms, thereby obtaining the coefficient for each term in the polynomial function. According to the present invention, the degree and number of terms of the polynomial, which approximate the shot surface shape, are given as job parameters from a man machine interface (not shown) or one line host to an exposure apparatus. If the degree is zero, differences from the global tilt plane are averaged among a plurality of sample shots, thereby generating the pattern offset correction table. In the case of a quadratic polynomial, a function Fz as shown below is obtained. In the function, reference symbols A to F are coefficients to be calculated in step 1103. The coefficient A is used to correct the projection lens image plane (best focus plane) and causes the image plane to conform to the shot surface, as shown in FIG. 6.

$$Fz(X,Y)=A*X^2+B*Y^2+C*X*Y+D*X*Y+E*Y+F$$

In step 1104, a difference of shot shape data with respect to the function Fz is calculated. The calculation result represents an amount relative to the approximate curve for each mark. This shift amount is considered to be an offset due to a circuit (underlying) pattern and is set in the pattern offset correction table 916. In this embodiment, an approximate plane is obtained by applying a function profile of an approximate curve of a shot surface shape to a high-degree polynomial, which uses X and Y coordinate values as factors. However, a method of obtaining an approximate plane is not limited to this. For example, if an approximate curve is obtained by performing an arithmetic operation, which folds a filter function with an appropriate cutoff spatial frequency for the shot surface shape data, an equivalent result can also be obtained. More specifically, the shot surface shape data need only be expressed by an expression (approximate function, table, or the like) including only appropriate low spatial frequency components. In this manner, a profile, which can be expressed by the expression is considered to be a shot surface shape to be followed by focus control. A difference from the expression is considered to be a circuit pattern formed in an underlying layer or a focus measurement error, which is caused by scattering of focus measurement light, and is inhibited from following by focus control. In consideration of this, various methods other than the above-mentioned ones can be adopted as a shot surface shape approximation method.

As for the cutoff spatial frequency in the above description, even if the driving response frequency of the wafer stage is designed to be high, and the target value for any shape can be followed, the imaging result is averaged by the width of an exposure slit. Making the driving target profile have excessively high spatial frequency components is meaningless. On the contrary, it may cause vibrations in the X and Y directions and may decrease the synchronization precision between the reticle stage and the wafer stage. Assume that the shot size (field angle) is 26×33 mm, and the slit width is about 7 mm. In this case, a driving target profile, which includes a spatial frequency component of about 2 periods/shot size at most is effective, and one which includes a larger spatial frequency component is not so effective.

Figure 18:
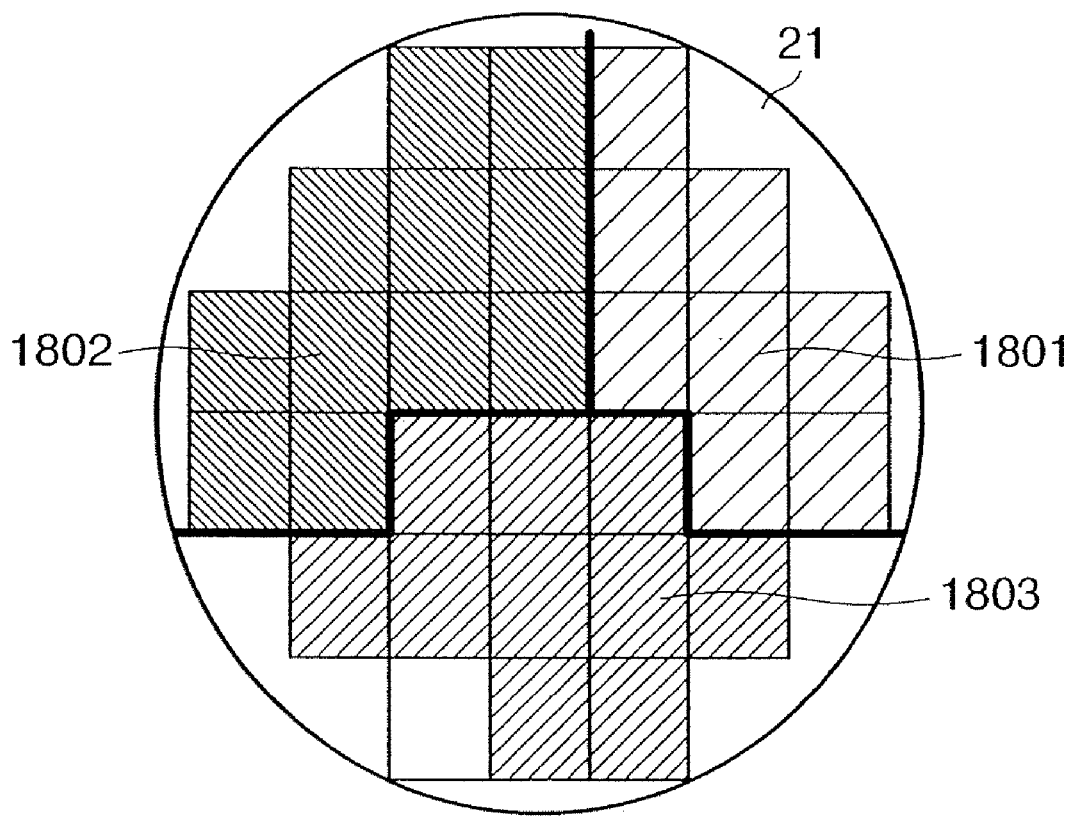
FIG. 18 is a view showing the state wherein an exposure shot within a wafer is divided into a plurality of zones.

FIG. 18 is a view of the state wherein an exposure shot within the wafer 21 is divided into a plurality of zones. The approximate curved surface function $Fz(X,Y)$ may be calculated for each of zones 1801 to 1803 in FIG. 18. If the number of zones increases, the number of sample shots for obtaining the approximate curved surface function must be increased. In this case, the radius of the wafer 21 increases. This is effective in the case of a process wafer whose shot surface shape is not uniform. The zoning can be designated as zone layout information from a user interface or on line host (not shown) before the job starts.

The approximate curved surface function $Fz(X,Y)$ may be calculated for each of the pattern offset measurement sample shots 501 to 508 (FIG. 4). An approximate curved surface function for an exposure shot other than a sample shot can be obtained by estimating coefficients from the positional relationship between sample shots by means of interpolation, extrapolation, or the like. The coefficients of shots arranged on the border between zones can be made to follow a change in shot surface shape between zones by estimating using this method. In a wafer whose surface shape is rough, the coefficients of the approximate curved surface function greatly vary depending on the pattern offset sample shot. For this reason, abnormal value determination logic may be prepared for the value for the coefficient of each sample shot or the statistics (distribution value), and defective wafer determination may be performed. If a defective wafer is found, an error message is displayed to the operator, while if continuation is instructed, pattern offset measurement only needs to be performed for the next wafer.

Figure 19:
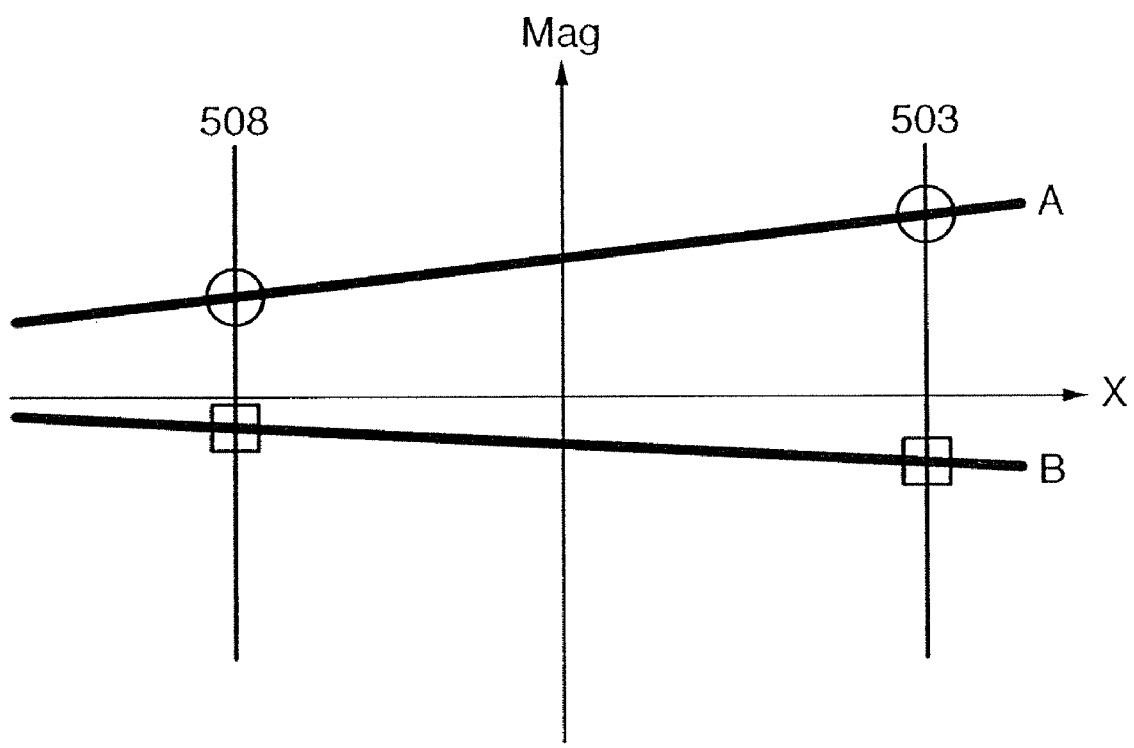
Figure 20:
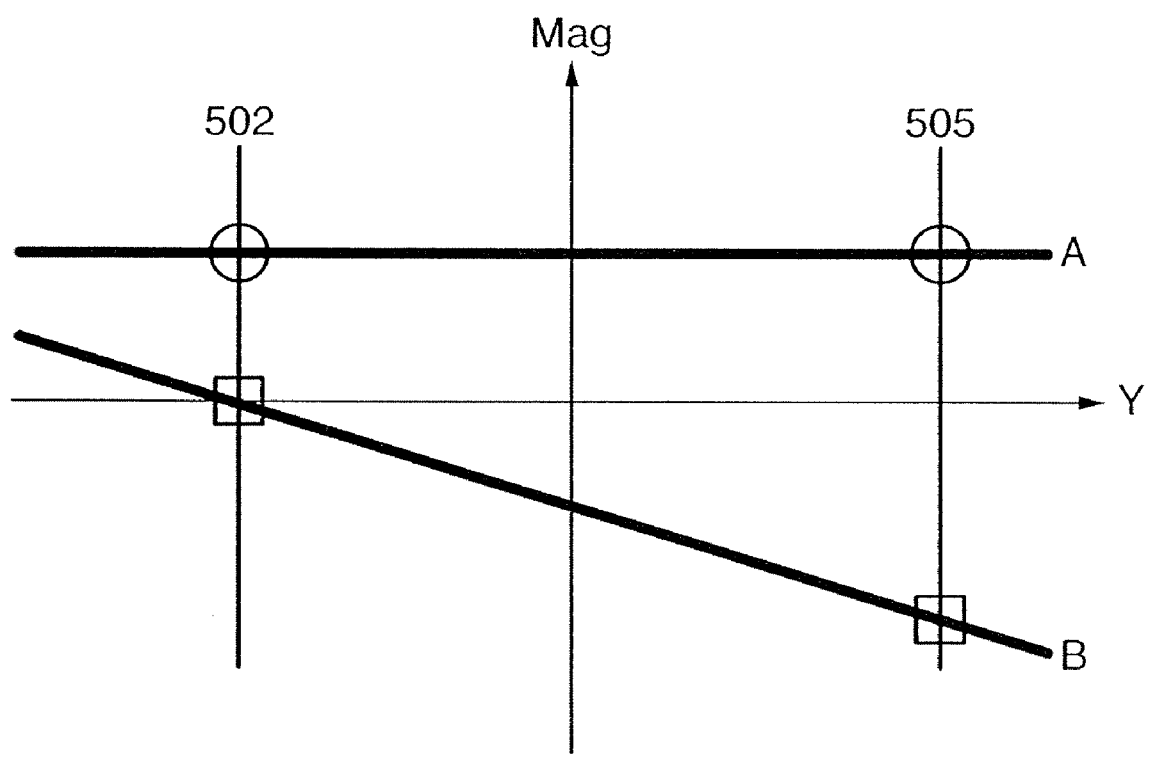

FIGS. 19 and 20 are examples of the procedures for estimating coefficients from the positional relationship between sample shots by means of interpolation, extrapolation, or the like. Assume that coefficients A and B of an approximate curved surface function Fz 503 of the pattern offset sample shot 503 spaced apart in the X direction and those of an approximate curved surface function Fz 508 of the pattern offset sample shot 508 are calculated separately. Coefficients A and B of shots at positions other than those for sample shots can be obtained by, e.g., performing linear interpolation with respect to the X axis dependence between A and B of the function Fz 503 and A and B of the function Fz 508. As for the Y-axis dependence in FIG. 20, the coefficients can be calculated in the same procedure. These interpolation calculations are performed for coefficients obtained for each scanning direction. As an interpolation method, advanced interpolation calculation using a high-degree function or spline function can be applied as far as the number of sample shots satisfies the degrees of freedom. Other coefficients of approximate curved surface functions can be obtained using the interpolation method. As an alternative, a method of changing a weighting coefficient for each sample shot (weighed addition of coefficients) can be adopted, and the same effect can be obtained. This method is effective when the number of sample shots is insufficient.

The shot surface shape may vary depending on the wafer sheet. In the example shown in FIG. 10, a sequence wherein pattern offset measurement is performed once only for the first wafer in one job has been described. In the case of, e.g., a job which requires processing a large number of wafers, pattern offset measurement 1011 may be performed a plurality of times to reduce variation between sheets. For example, if an interval (by the number of wafers) between pattern offset measurement operations is designated as a parameter set for each job, pattern offset measurement 1011 is performed when the number reaches a specified number, and the correction coefficient 901 and pattern offset correction table 916 in FIG. 9 are updated, the influence of variations in shot surface shape, which may occur between sheets, can be reduced. In addition, assume that a deviation amount from the pattern imaging plane position of the shot surface position measured by the slit sensor within a shot during exposure exceeds a tolerance designated in advance by the average value within the shot of absolute values of deviation amounts with respect to the Z-axis within the wafer in a plurality of shots. In this case, if the pattern offset is measured again, the number of times of pattern offset measurement operations can be minimized in a job.

FIG. 21 shows an example of a log which records a pattern offset measurement result according to the preferred embodiment of the present invention. It is meaningful for increasing the uniformity of a process wafer to log each coefficient of an approximate curved surface function obtained by measurement and re-measurement of the pattern offset and trace its change. LotID is a tag indicating the ID for identifying a lot to be processed. Log data that pertains to SPOC measurement is sandwiched by SPOC tags such that they are distinguishable from tags generated from another sequence. SPOC_MeasurementNo is a tag for identifying the count for the times of pattern offset measurement operations within a lot. SPOCsigma is a standard deviation of values which constitute the pattern offset correction table 916 in FIG. 9. This value can take various values depending on the underlying layer of a process wafer to be processed. If this value is large, a difference in level of the pattern of the underlying layer is large. This does not means that the wafer distorts greatly. SPOCdiff is a tag for identifying information (offset relative difference information) that pertains to a difference between pattern offset correction tables in scanning directions (vertical direction). SPOCfunc is a coefficient of the polynomial approximate curved surface and is recorded for each scanning direction. After that, a log is recorded for Wiaf (Wafer Image Auto Focus) which is performed subsequently to SPOC measurement. When pattern offset measurement is performed again, data enclosed by the SPOC tags, as described above, is described as a log at that timing.

In this manner, polynomial approximate curved surfaces described above, i.e., shot surface shapes among wafer sheets can be monitored using a log as described above. This makes it possible to observe the uniformity of a process wafer within a lot. In some cases, error determination may be performed on the basis of the log information, and processing may be stopped.

(Embodiment of a Device Production Method)

A device production method using the above-mentioned exposure apparatus as an embodiment will be described next.

Figure 22:
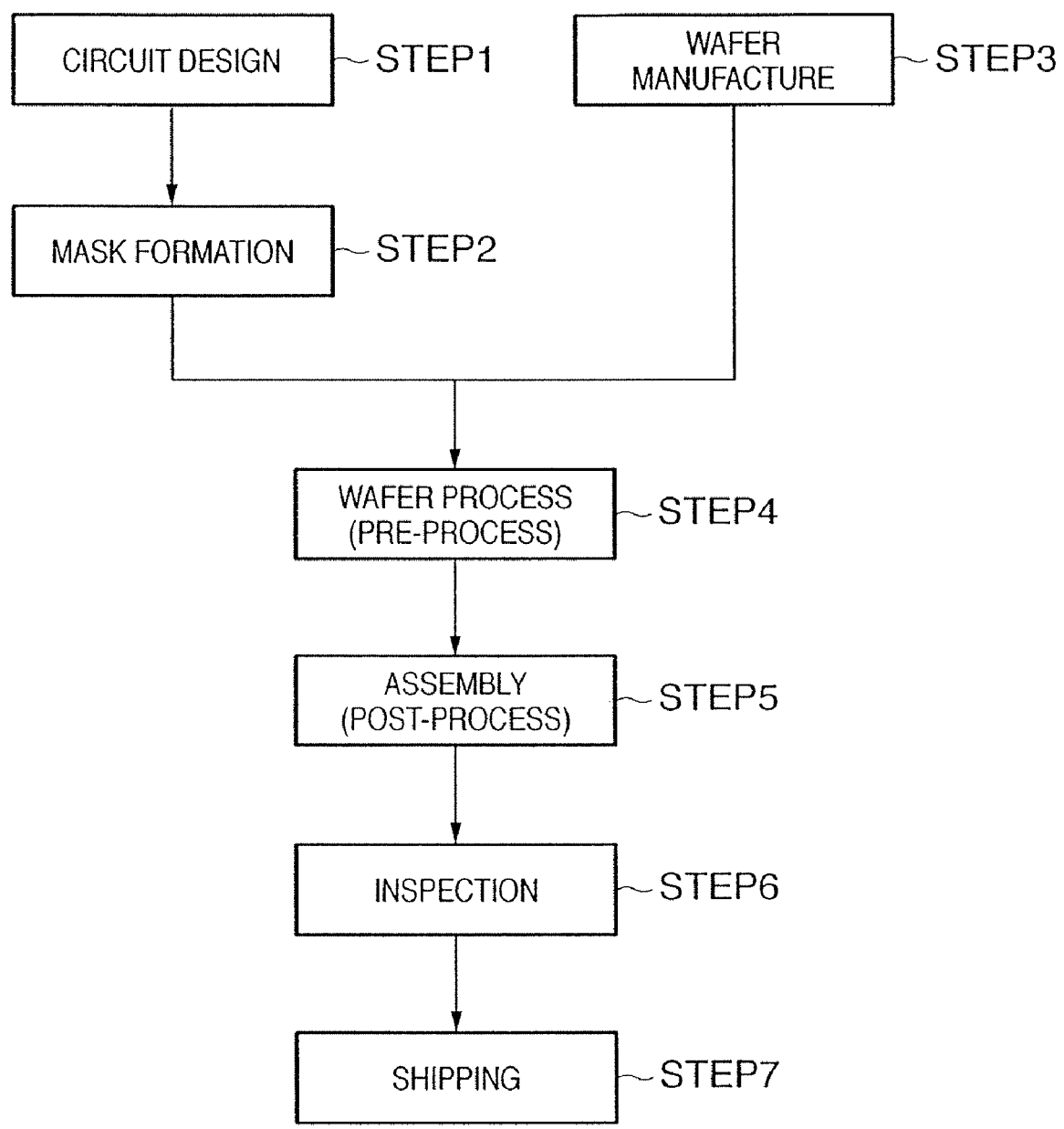
FIG. 22 is a flowchart showing the flow of the manufacture of a microdevice.

FIG. 22 shows the flow of manufacturing a microdevice (e.g., a semiconductor chip such as an IC or LSI, a liquid crystal panel, a CCD, a thin film magnetic head, micromachine, or the like). In step 1 (circuit design), a device pattern is designed. In step 2 (mask formation), a mask having the designed pattern is formed. In step 3 (wafer manufacture), a wafer is manufactured by using a material such as silicon. In step 4 (wafer process), called a pre process, an actual circuit is formed on the wafer by lithography using the prepared mask and wafer. Step 5 (assembly), called a post process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test of the semiconductor device manufactured in step 5. After these steps, the semiconductor device is completed and shipped (step 7).

Figure 23:
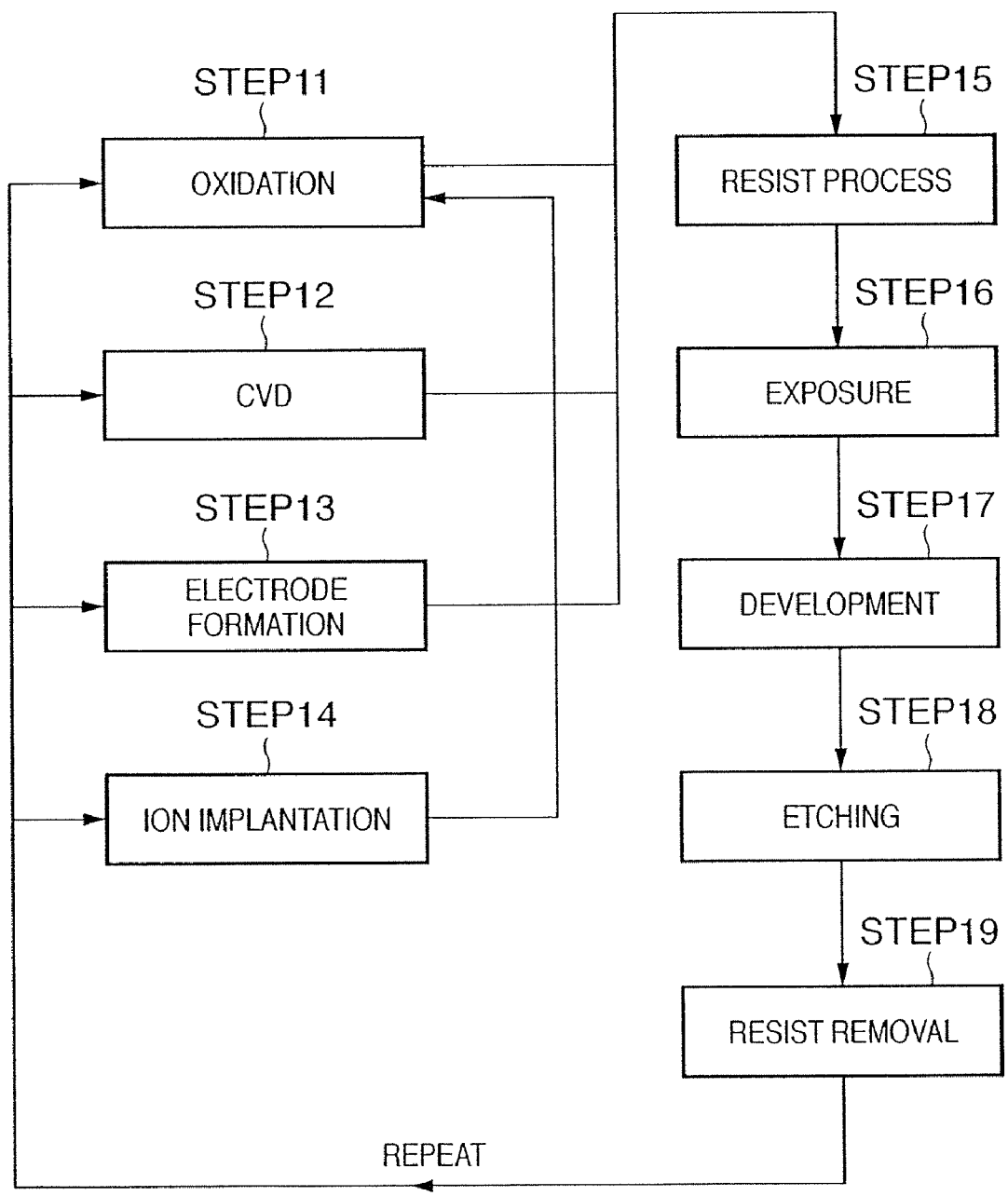
FIG. 23 is a flowchart showing the detailed flow of the wafer process in FIG. 22.

FIG. 23 shows the detailed flow of the above-mentioned wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the mask circuit pattern is transferred onto the wafer using an exposure apparatus, which is one of the above-mentioned device manufacturing apparatuses. In step 17 (development), the exposed wafer is developed. In step 18 (etching), the resist is etched except for the developed resist image. In step 19 (resist removal), an unnecessary resist after etching is removed. These steps are repeated to form multiple circuit patterns on the wafer.

With a production method according to this embodiment, a high integration degree device, which has conventionally been difficult to manufacture, can be manufactured at a low cost.

As has been described above, according to the present invention, the focus performance by scanning exposure can be increased.

As many apparently widely different embodiments of the present invention can be made without departing from the spirit and scope thereof, it is to be understood that the invention is not limited to the specific embodiments thereof except as defined in the claims.

CLAIM OF PRIORITY

This application claims priority from Japanese Patent Application No. 2003-362867 filed on Oct. 23, 2003, which is hereby incorporated by reference herein.

The invention claimed is:

1. A scanning exposure apparatus for performing exposure of a substrate to light via an original, while the substrate and the original are scanned, said apparatus comprising:
    a projection optical system configured to project light from the original onto the substrate;
    a stage configured to hold the substrate and to move in a scanning direction perpendicular to an optical axis of said projection optical system; and
    a focus detector configured to detect a position of a surface region of the substrate in a direction of the optical axis,
    said apparatus being configured (i) to detect, using said focus detector, a position of the surface region with respect to each of a plurality of shot regions of the substrate to obtain a plane that approximates a surface of the substrate, (ii) to detect, using said focus detector, with the surface of the substrate aligned with the plane, the position of the surface region with respect to each of a plurality of measurement points in each of a plurality of shot regions of the substrate, (iii) to average the detected positions obtained in (ii) over the plurality of shot regions with respect to each of the plurality of measurement points, (iv) to obtain a function which represents a surface that approximates the averaged positions respectively obtained with respect to the plurality of measurement points, (v) to calculate a difference between each of the averaged positions and a value of the obtained function with respect to each of the plurality of measurement points, (vi) to offset a position detected by said focus detector with respect to each of the plurality of measurement points in a shot region of the substrate with a corresponding one of the calculated differences during the exposure, and (vii) to control a position of said stage based on each of the offset positions during the exposure.

2. An apparatus according to claim 1, wherein said apparatus is configured to control, during the exposure, a position of said stage, by generating a target position, in the direction of the optical axis, of said stage, based on each of the offset positions and the corresponding value of the obtained function.

3. An apparatus according to claim 2, wherein said apparatus is configured to further detect, by said focus detector, a position, in the direction of the optical axis, of the surface region, which is away from the optical axis in the scanning direction.

4. An apparatus according to claim 1, wherein said apparatus is configured to detect, by said focus detector, a position, in the direction of the optical axis, of the surface region, which is away from the optical axis in a direction opposite to the scanning direction.

5. An apparatus according to claim 1, wherein the function includes a polynomial with respect to a position within a plane perpendicular to the optical axis.

6. An apparatus according to claim 5, wherein said apparatus is configured to change at least one of a degree and a number of terms of the polynomial.

7. An apparatus according to claim 5, wherein a degree of the polynomial is greater than one.

8. An apparatus according to claim 1, wherein said apparatus is configured to change a shape of an image plane of said projection optical system based on the obtained function.

9. An apparatus according to claim 1, wherein said apparatus is configured to obtain the function with respect to each of a plurality of zones in a surface of the substrate.

10. An apparatus according to claim 9, wherein said apparatus is configured so that the plurality of zones are designated.

11. An apparatus according to claim 1, wherein said apparatus is configured to log the obtained function.

12. An apparatus according to claim 11, wherein said apparatus is configured to warn of an error based on the logged function.

13. An apparatus according to claim 1, wherein said apparatus is configured to obtain the function with respect to a subset of substrates within a lot of substrates, the subset including the first substrate within the lot.

14. An apparatus according claim 1, wherein said apparatus is configured to calculate the function for a subsequent substrate, within a lot of substrates, based on positions detected by said focus detector with respect to the plurality of measurement points during the exposure.

15. A method of manufacturing a device, said method comprising steps of:
   exposing a substrate to light using a scanning exposure apparatus defined in claim 1;
   developing the exposed substrate; and
   processing the developed substrate to manufacture the device.

* * * * *